United States Patent [19]
Akiyama

[11] Patent Number: 5,930,494
[45] Date of Patent: Jul. 27, 1999

[54] PROCESS SIMULATOR AND PROCESS SIMULATING METHOD

[75] Inventor: Yutaka Akiyama, Tokyo, Japan

[73] Assignee: NEC Corporation, Tokyo, Japan

[21] Appl. No.: 08/672,756

[22] Filed: Jun. 28, 1996

[30] Foreign Application Priority Data

Jun. 28, 1995 [JP] Japan .................................. 7-161336

[51] Int. Cl.⁶ .................................................. G06F 9/455
[52] U.S. Cl. ......................... 395/500; 252/401; 252/243; 257/51; 257/347; 364/570; 364/578; 364/488; 437/239; 437/69; 357/23
[58] Field of Search ............................... 357/23; 252/401, 252/247; 364/570, 578, 488; 437/239, 69; 395/117, 500; 257/51, 347

[56] References Cited

U.S. PATENT DOCUMENTS

| | | | |
|---|---|---|---|
| 4,152,714 | 5/1979 | Hendrickson et al. | 357/23 |
| 4,310,438 | 1/1982 | Steelhammer et al. | 252/401 |
| 5,315,537 | 5/1994 | Blacker | 364/570 |
| 5,434,109 | 7/1995 | Geissler et al. | 437/239 |
| 5,502,643 | 3/1996 | Fujinaga | 364/488 |
| 5,617,322 | 4/1997 | Yokota | 364/488.04 |
| 5,659,774 | 8/1997 | Saito et al. | 395/117 |
| 5,661,311 | 8/1997 | Takemura et al. | 257/51 |
| 5,671,395 | 9/1997 | Akiyama | 395/500 |
| 5,674,776 | 10/1997 | Mathews et al. | 437/69 |

OTHER PUBLICATIONS

Isomae "Semiconductor Process Device Simulation Techniques", pp. 79–89, (1990).

Tosho, "Process Device Simulation Techniques", pp. 91–122, (1988).

Mock, "Tetrahedral Elements and the Scharfetter–Gummel Method", *Proceeding of the Nasecode IV*, pp. 36–47, (1985).

Rafferty et al., "Iterative Methods In Semiconductor Device Simulation", *IEEE Transactions on Electron Devices*, vol. ED–32(10):2018–2027, (1985).

Morisue, "VLSI Design–Manufacture Simulation", pp. 51–62., (1987).

*Primary Examiner*—Kevin J. Teska
*Assistant Examiner*—M. Irshadullah
*Attorney, Agent, or Firm*—Foley & Lardner

[57] ABSTRACT

A process simulator comprising a triangular mesh generating unit for generating a triangular mesh to a semiconductor device to be processed, a control volume defining unit for defining a control volume on the triangular mesh, an impurity concentration setting unit for setting up the concentration of impurity with respect to the control volume, an oxidation calculating unit for calculating an oxidation process and deforming the triangular mesh, a control volume deforming unit for deforming the control volume, an impurity concentration modifying unit for modifying the impurity concentration according to the deformed control volume, an impurity concentration transferring unit for transferring the modified impurity concentration to the control volume defined on the triangular mesh newly generated to the deformed semiconductor device, and a diffusion calculating unit for performing a diffusion calculation.

12 Claims, 17 Drawing Sheets

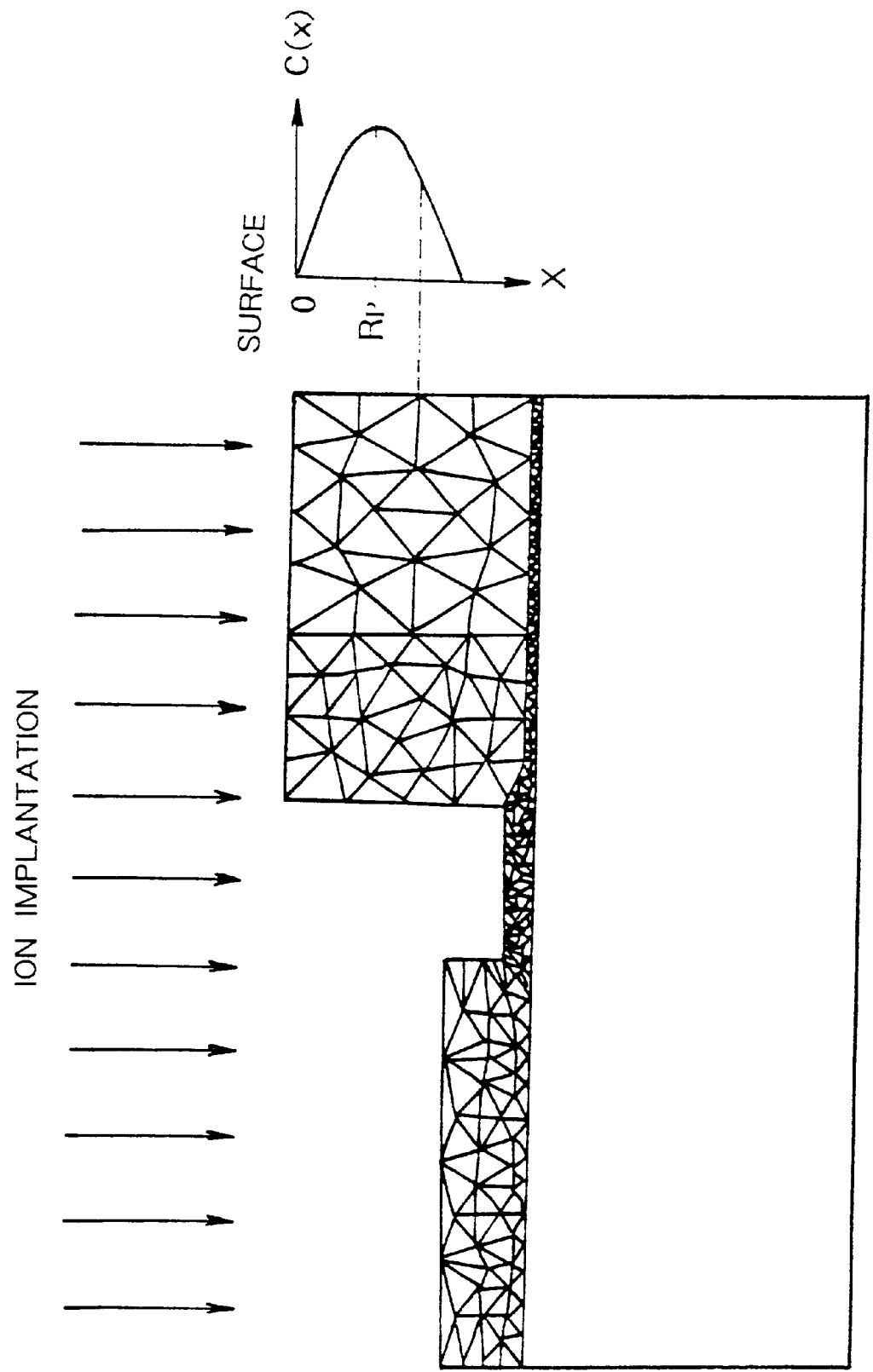

(PRIOR ATR)

NEW NODE

— OUTERMOST CONTOUR

PROCESS SIMULATOR AND PROCESS SIMULATING METHOD

BACKGROUND OF THE INVENTION

1. Field of the Invention

The present invention relates to a process simulator and process simulating method that predicts an internal physical quantity and configuration of an impurity profile or the like in the process of manufacturing a semiconductor device.

2. Description of the Related Art

When manufacturing a semiconductor transistor (referred to as a semiconductor device, hereinafter), the manufacturing processes of the semiconductor device including oxidation process, diffusion process, ion implantation process, and the like are simulated by a process simulator using a computer, and an internal physical quantity and configuration of an impurity profile of the semiconductor device are predicted. For example, when oxidation and diffusion are applied to an ion-implanted initial configuration, it is possible that changes in the configuration owing to the oxidation and the diffusion of the impurity in its oxidation atmosphere in each oxidation/diffusion time are solved by turns to predict the final configuration of the device and the changes in the impurity profile according to the time passing.

The use of a process simulator, for the purpose of optimizing the semiconductor device so that the device displays the best electrical characteristics, can save the trouble of actually manufacturing the LSI (large-scale integration) and verifying its electrical characteristics, thereby reducing the production cost of the semiconductor device and shortening the time required for the production. Since the process simulator calculates the internal physical quantity inside the semiconductor device, it is also possible to analyze behavior inside the semiconductor device.

In the process simulator, in order to obtain the value of a physical quantity inside the semiconductor device, it is necessary to solve partial differential equations such as diffusion equation of continuity which expresses the behavior of the impurity. However, since the partial differential equations cannot be analytically solved, the calculation is performed by dividing the semiconductor device into smaller regions and making the partial differential equations discrete. As for the technique of this kind, for example, there is a method described from pp. 51 to pp. 62 ("3. Process Simulator, Chapter 3 Process Simulation") of "VLSI Design-Manufacture Simulation" (edited by Michitada Morisue, published by CMC Ltd., 1987). In the literature, a method for calculating a one dimensional profile due to oxidation and diffusion is described.

Also, as for anther technique of the conventional art, there is a technique described from pp. 91 to pp. 122 ("3. Device Simulation") of "Process Device Simulation Techniques" (written and edited by Ryo Dan, published by Sangyo Tosho, 1988). In the literature, as an example of analyzing a two dimensional structure, a method of calculating by dividing the semiconductor device into smaller rectangular regions and making the partial differential equations discrete is described.

On the other hand, in the case of analyzing the semiconductor device having complex configuration like LOCOS (Local Oxidation of Silicon) configuration or trench configuration, there is a method of using a triangle to divide the configuration into smaller regions and making it discrete in order to correctly express the configuration of the semiconductor. As for the method, the detail is found in "Iterative Methods in Semiconductor Device Simulation" (C. S. Rafferty, M. R. Pinto, IEEE Transaction on Electron Devices, Vol. ED-32, No. 10, October, 1985). According to the literature, when simulating the trench structure, the configuration of the semiconductor can be expressed as a set of triangular elements in the case where the configuration is divided into smaller regions, e.g. discrete triangles, as shown in FIGS. 13 and 14. Therefore, the trench structure can be correctly expressed. Here, FIG. 13 is a schematic sectional view of the semiconductor device. FIG. 14 shows the state where the sectional view of the semiconductor device in FIG. 13 is expressed by a set of discrete triangular elements.

FIG. 15 is a schematic view showing a part of the semiconductor device as shown in FIGS. 13 and 14. Hereinafter, referring to FIG. 15, the solution of the partial differential equation by the finite difference method using the triangular elements will be explained.

First, an impurity concentration and an electric potential caused by the activated impurity are defined on each mesh node (a vertex of a triangle). The impurity is diffused owing to the concentration gradient and the electric potential gradient, and a flux of the impurity during diffusion is defined on a edge of the triangle.

Now, according to the Gauss' theorem, in the definition of a closed curved surface, the total amount resulted from integrating the impurity by volume in the closed curved surface is equal to the amount resulted from integrating the flux vertically crossing the closed curved surface by area. Therefore, it is necessary to define the closed curved surface perpendicular to the flux in order to apply the Gauss' theorem to the discrete way by the triangles as mentioned above. Namely, it is necessary to define the closed curved surface in the Gauss' theorem as a region surrounding the perpendicular bisectors of the sides of the triangles whose sides are respectively connected to the vertices, i.e., as a region formed by connecting the circumcenters of the respective triangles. Here, the closed curved surface of each joint (each vertex of the triangles) is generally called a control volume. In this case, the total amount of the impurity each joint governs is obtained by multiplying the impurity concentration of the joint by the volume of the control volume (if in the case of two dimension, assume that the depth is 1). Then, by calculating the total amount of the impurity one by one and adding the results with respect to all of the vertices in the system being analyzed, the total amount in the system is equal to the total dose amount in the ion implantation.

Now, the definition of an appropriate control volume (the open curved surface at each joint) necessitates a condition that the circumcenters of the adjacent triangles do not intersect each other essentially. The reason is that if the circumcenters of the adjacent triangles intersect each other, the product of the section when the flux is integrated by area becomes negative. If the condition is not satisfied, there causes such a projection of the electric potential that could not physically occur, as shown in FIG. 16. In FIG. 16, the triangular mesh is partially omitted. While, if the control volumes intersect each other, the total amount of the impurity is not equal to the total dose amount in the ion implantation, even if the total amount is obtained by multiplying the impurity concentration of the node by the volume of the control volume, calculating in this way with respect to all of the vertices in the system to be analyzed, and adding the results.

In order to avoid the above problems, it is required to guarantee the Delaunay partitioning that there is no vertex of other triangles within the circumscribed circle of the triangle at issue, and to perform the triangular division, thereby to satisfy the condition that the circumcenters of the adjacent triangles do not intersect each other. As for the method for guaranteeing the Delaunay partitioning and performing the triangular division, there is a description in "Tetrahedral elements and the Scharfetter-Gummel method" (M. S. Mock, Proceeding of the NASECODE IV, pp. 36 to pp. 47, 1985) that the new joints required for improving the calculation accuracy, i.e., the material boundary points are added one by one to a group of the triangles that have already been divided by the Delaunay partitioning.

In other words, as shown in FIG. 17(A), a new joint is added to a group of the triangles that have already been divided by the Delaunay partitioning, and triangles having circumscribed circles including the new joint are searched. Next, as shown in FIG. 17(B), the searched triangles are deleted, and the outermost contour of the region formed by the deleted triangles is extracted (the portion indicated by the bold lines in the drawing). Then, as shown in FIG. 17(C), new triangles are formed by connecting the sides of the extracted outermost contour with the new joint. The group of the triangles newly formed according to the above method are also divided by the Delaunay partitioning.

However, according to the conventional method of the process simulation mentioned above, since the configuration of the semiconductor device varies in calculating the oxidation process, the discrete configuration by a triangular varies as well. Even if the Delaunay partitioning is guaranteed to the configuration of the semiconductor device before oxidation, the triangular configuration varies according to the oxidation, and therefore, the Delaunay partitioning can't be guaranteed after oxidation. When solving the diffusion equation after oxidation, it is necessary to perform the triangular division once more so as to guarantee the Delaunay partitioning to the configuration of the deformed semiconductor device.

Further, even if executing the triangular division with the Delaunay partitioning guaranteed to the deformed configuration after oxidation, the reformed configurations of the new triangular elements are different from those before oxidation, so that the control volumes vary according to the change in the configuration. Therefore, even if multiplying the impurity concentration of each joint by the volume of the control volume one by one and adding these values after oxidation with respect to all of the vertices in the system to be analyzed, the total dose amount of the impurity before the deformation owing to the oxidation cannot be reserved.

In addition, in order to improve the analytic accuracy in solving the diffusion equation, a new joint may need to be added when reforming the triangles on the deformed semiconductor device after oxidation. In this case, it is necessary to define the impurity concentration of the added joint, which takes a lot of trouble defectively.

SUMMARY OF THE INVENTION

A first object of the present invention is to provide a process simulator that can execute the triangular division so as to guarantee the Delaunay partitioning to the deformed configuration of the device, even if the configuration of the semiconductor device varies owing to the oxidation.

A second object of the present invention is, in addition to the first object, to provide a process simulator that can reserve the total dose amount of the impurity before the deformation owing to the oxidation, when executing the triangular division so as to guarantee the Delaunay partitioning to the deformed configuration of the device.

A third object of the present invention is, in addition to the first object, to provide a process simulator that can set a new node, if necessary, based on the impurity concentration of each node on the triangular mesh after deformation caused by the oxidation, reduce the discrete error, and improve the analytical accuracy, when the triangular division is done so as to guarantee the Delaunay partitioning to the deformed configuration of the device.

A fourth object of the present invention is, in addition to the third object mention above, to provide a process simulator that can save the trouble of defining the impurity concentration of the added joint again, if a new joint is added when the triangular mesh is generated after deformation owing to the oxidation.

According to one aspect of the invention, a process simulator for calculating an internal physical quantity inside a semiconductor by dividing the semiconductor to be processed into smaller triangular regions and solving partial differential equations analytically, comprises:

a triangular mesh generating means for generating a triangular mesh that guarantees the Delaunay partitioning, on the semiconductor device to be processed, at least two times, in the initial stage and after deformation due to an oxidation calculation;

a control volume defining means for defining a control volume to the triangular mesh generated by the triangular mesh generating means;

an impurity concentration setting means for setting up an impurity concentration to the control volume defined by the control volume defining means;

an oxidation calculating means for calculating an oxidation process of the semiconductor device and deforming the triangular mesh;

a control volume deforming means for deforming the control volume according to the triangular mesh deformed by the oxidation calculation;

an impurity concentration modifying means for modifying the impurity concentration set by the impurity concentration setting means according to the control volume deformed by the control volume deforming means;

an impurity concentration transferring means for transferring the impurity concentration modified by the impurity concentration modifying means to the control volume defined on the triangular mesh newly generated to the semiconductor device deformed by the oxidation calculation; and a diffusion calculating means for performing a diffusion calculation according to the finally determined triangular mesh, control volume and impurity concentration.

In the preferred construction, the impurity concentration transferring means may seek the region where the control volume deformed by the control volume deforming means and the control volume defined on the triangular mesh newly generated to the semiconductor device deformed by the triangular mesh generating means overlap each other, calculate the number of the impurity in the overlapping region, set up the value obtained by dividing the total amount of the impurity in the overlapping region by the area of the control volume defined on the triangular mesh newly generated as the impurity concentration of each joint on the triangular mesh newly generated.

In another preferred construction, the triangular mesh generating means may generate the triangular mesh by setting a new node if necessary, when newly generating the triangular mesh that guarantees the Delaunay partitioning to the semiconductor device deformed by the oxidation calculation.

Also, the triangular mesh generating means may generate the triangular mesh by setting a new joint at a place where the impurity concentration modified by said impurity concentration modifying means varies extremely, when newly generating the triangular mesh that guarantees the Delaunay partitioning to the semiconductor device deformed by the oxidation calculation.

In another preferred construction, the triangular mesh generating means generates the triangular mesh by setting a new joint in the middle of the adjacent joints where the difference of the impurity concentration is the predetermined value or above, when newly generating the triangular mesh that guarantees the Delaunay partitioning to the semiconductor device deformed by the oxidation calculation.

In another preferred construction, in the case of seeking the region where the control volume deformed by the control volume deforming means and the control volume defined on the triangular mesh newly generated to the semiconductor device deformed by the triangular mesh generating means overlap each other, the impurity concentration transferring means roughly divides the configuration of the semiconductor device into rectangular regions of appropriate size beforehand and seeks the overlapping region of the both control volumes only included in the rectangular region.

According to another aspect of the invention, a process simulation method for calculating an internal physical quantity inside a semiconductor by dividing the semiconductor to be processed into smaller triangular regions and solving partial differential equations analytically, comprises the steps of:

- a first step of generating a triangular mesh which guarantees the Delaunay partitioning, on the semiconductor device to be processed;
- a second step of defining a control volume to the generated triangular mesh;
- a third step of setting up an impurity concentration to the defined control volume;
- a fourth step of calculating an oxidation process to the semiconductor device and deforming the triangular mesh;
- a fifth step of deforming the control volume according to the triangular mesh deformed by the oxidation calculation;
- a sixth step of modifying the impurity concentration defined on the pre-deformed control volume according to the control volume deformed by said control volume deforming means;
- a seventh step of newly generating the triangular mesh that guarantees the Delaunay partitioning to the semiconductor device deformed by the oxidation calculation;
- an eight step of defining a control volume on the newly generated triangular mesh;
- a ninth step of transferring the impurity concentration modified by the sixth step to the control volume defined on the newly generated triangular mesh; and
- a tenth step of performing a diffusion calculation according to the finally determined triangular mesh, control volume and impurity concentration.

In the above-mentioned construction, the ninth step of transferring the impurity concentration includes a step of seeking the region where the control volume deformed by the control volume deforming means and the control volume defined on the triangular mesh newly generated to the semiconductor device deformed by the triangular mesh generating means overlap each other, a step of calculating the number of the impurity in the overlapping region, a step of setting up the value obtained by dividing the total amount of the impurity in the overlapping region by the area of the control volume defined on the triangular mesh newly generated as the impurity concentration of each joint on the triangular mesh newly generated.

In this case, a process simulation method further comprises a step of setting a new joint for forming a triangular mesh if necessary, between the sixth step of modifying the impurity concentration and the seventh step of newly generating the triangular mesh. Also, a process simulation method further comprises a step of setting a new node at a place where the impurity concentration modified by the sixth step varies extremely, between the six step of modifying the impurity concentration and the seventh step of newly generating the triangular mesh.

In the above-mentioned construction, in the step of seeking the region where the control volume deformed by the fifth step and the control volume defined newly by the eighth step overlap each other, the configuration of the semiconductor device is roughly divided into rectangular regions of appropriate size beforehand and the overlapping region of the both control volumes only included in the rectangular region is sought.

Other objects, features, and effects of the present invention will be apparent from the detailed description below.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings:

FIG. 4 is a schematic view showing the state of setting the impurity concentration when the impurity is introduced to the semiconductor device by the ion implantation.

DESCRIPTION OF THE PREFERRED EMBODIMENT

The present invention will be explained in detail with reference to the accompanying drawings.

Figure 1:
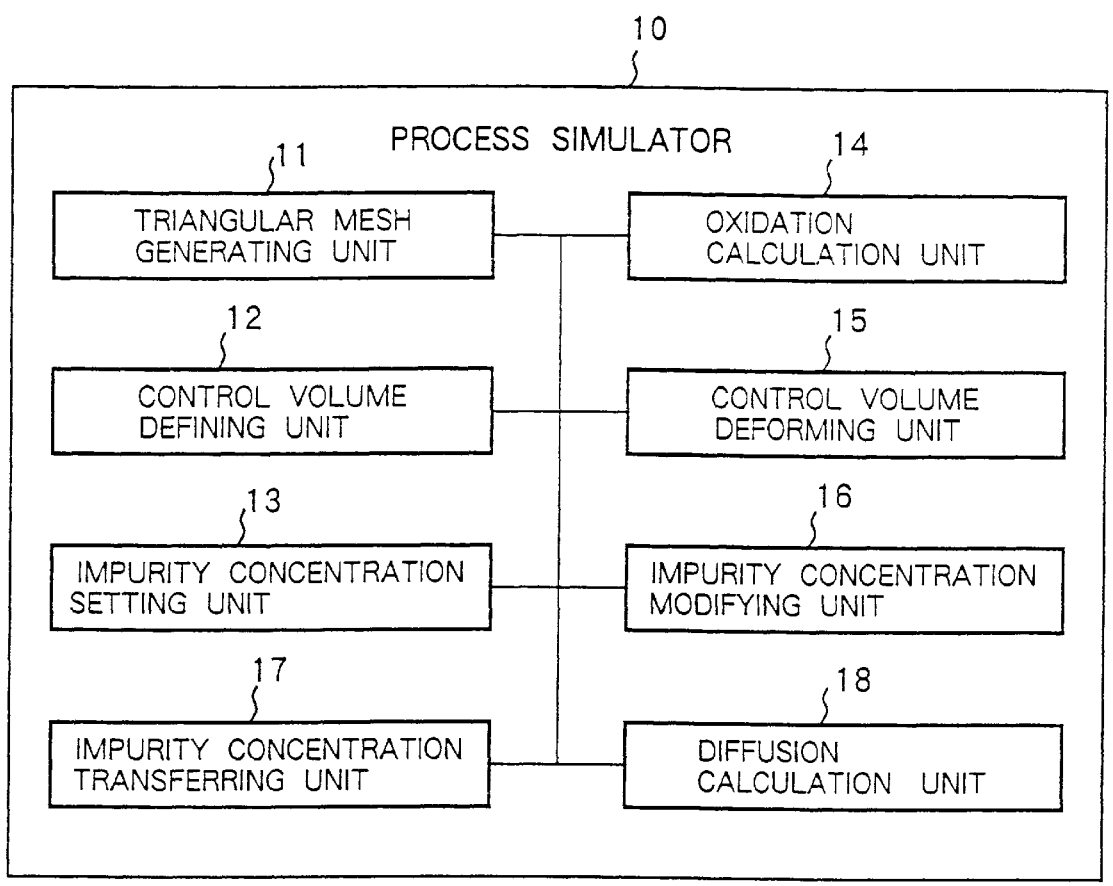
FIG. 1 is a block diagram showing a composition of a process simulator according to a first embodiment of the present invention.

FIG. 1 is a block diagram showing a composition of a process simulator according to a first embodiment.

As shown, a process simulator 10 of the present embodiment comprises a triangular mesh generating unit 11 for generating a triangular mesh on a semiconductor device to be processed, a control volume defining unit 12 for defining a control volume according to the generated triangular mesh, an impurity concentration setting unit 13 for setting up the concentration of the impurity according to the defined control volume, an oxidation calculating unit 14 for calculating an oxidation process of the semiconductor device, a control volume deforming unit 15 for deforming the control volume according to the triangular mesh that has been deformed due to the oxidation, an impurity concentration modifying unit 16 for modifying the concentration of the impurity according to the deformed control volume, an impurity concentration transferring unit 17 for justifying the impurity concentration according to the triangular mesh and control volume newly set to the semiconductor device deformed by the oxidation, and a diffusion calculation unit 18 for performing a diffusion calculation according to the finally determined triangular mesh, control volume and impurity concentration. FIG. 1 shows only the characteristic components in the present embodiment and other components are omitted therefrom. As a matter of fact, it is needless to say that the process simulator includes an input means for supplying the information about the semiconductor device to be processed, and a control means for controlling an operation of each processing unit.

The triangular mesh generating unit 11 is realized by a program-controlled CPU or the like, and generates a triangular mesh, which guarantees the Delaunay partitioning to the configuration of the semiconductor device to be processed. The generation of the triangular mesh by the triangular mesh generating unit 11 may be made to the initial configuration of the semiconductor device and to the configuration of the semiconductor that is deformed after the calculation of the oxidation. The triangular mesh produced to the initial configuration is called a pre-deformed triangular mesh and the triangular mesh produced to the deformed configuration of the semiconductor device is called a new triangular mesh. The method for producing the triangular mesh that guarantees the Delaunay partitioning is described in the above-mentioned article "Tetrahedral elements and the Scharfetter-Gummel method".

The control volume defining unit 12 is realized by a program-controlled CPU or the like, and defines the control volume to the triangular mesh generated by the triangular mesh generating unit 11. More specifically, the unit 12, giving attention to the nodes of the generated triangular mesh (the vertices which several triangles have in common) one after another, defines the region formed by connecting the circumcenters of the respective triangles having a node in common as a control volume on the joint. The definition of the control volume by the control volume defining unit 12 may be made to the pre-deformed triangular mesh and to the new triangular mesh. The control volume defined to the pre-deformed triangular mesh is called a pre-deformed control volume and the control volume defined to the new triangular mesh is called a new control volume.

The impurity concentration setting unit 13 is realized by a program-controlled CPU or the like, and sets up the concentration of the impurity at each node where the pre-deformed control volume has been defined, which impurity is introduced to the semiconductor device by the use of a technique such as ion implantation. FIG. 4 shows the setting state of the impurity concentration when the impurity is introduced to the semiconductor device by the ion implantation. A method for setting up the impurity concentration will be hereinafter explained with reference to FIG. 4. In FIG. 4, the triangular mesh is drawn with respect to the characteristic part only.

In the impurity profile by the ion implantation, the impurity concentration can be defined by a distance from a material surface (the surface of the semiconductor device) by the use of an analytical formula. For example, when using the Gaussian distribution, the impurity concentration C(x) is expressed as follows:

$$C(x)=N/(2\pi \Delta R_p)^{1/2} \cdot \exp[-(x-R_p)^2/\Delta R_p^2] \quad (1)$$

Here, N is a dose amount of an ion implantation, $R_p$ is an average projection range (the peak value in the distribution curve of the impurity concentration C(x)), and x is a distance from the material surface.

As shown in FIG. 4, the unit 13 calculates a distance (X) from the material surface to be ion-implanted to a coordinate of each vertex of the triangles, and uses the above formula (1) to define the impurity concentration at each vertex of the triangles.

The oxidation calculating unit 14 is realized by a program-controlled CPU or the like, and performs an oxidation calculation to the semiconductor device to deform the configuration of the semiconductor device and the triangular mesh. More specifically, the unit 14 analyzes the change in the configuration of the semiconductor device due to the oxidation, predicts the final configuration of the semiconductor device and the changes of the impurity profile according to the time passing, and deforms the configuration of the semiconductor device on the basis of the prediction. Correspondingly with this, the triangular mesh generated on the semiconductor device will be deformed. The triangular mesh deformed by the oxidation calculation is called a deformed triangular mesh. The deformation of the triangular mesh is realized by shifting the coordinates of the respective vertices of the triangles on the basis of the changes in the configuration of the semiconductor device.

Here, the oxidation calculation is executed as follows. First, if the triangular mesh has a pre-deformed configuration, for example, such as shown in FIG. 5, the two dimensional Laplace equation $$D\nabla^2 C(x, y)=0 \quad (2)$$

is solved to seek the distribution of the oxidizing agent in the oxidized film. Here, D is a diffusion constant of the oxidizing species, C(x, y) is a concentration of the oxidizing species.

The boundary conditions are the concentration of the oxidizing species in the oxidized surface and the shift of the oxidized surface caused by the expansion of the volume, which can be obtained from a reaction constant. Further, an equilibrium $$\sigma_{ij,j}=0 \quad (3)$$

and a construction relation $$\sigma_{ij}=\epsilon_{kl}(0)G_{ijkl}(t)+\int G_{ijkl}(t-\gamma)[\partial \epsilon_{kl}(\gamma)/\partial \gamma]d\gamma \quad (4)$$

are solved. Here, $\sigma_{ij}$ is a stress component, t is a time, $\epsilon_{kl}$ is distortion, $G_{ijkl}(t)$ is a relaxation function, and $\int$ is an integral of 0 to t.

If the equilibrium (3) and the construction relation (4) are solved by making them discrete by the use of the finite element method or the like, a shift amount of a vertex of each triangle can be obtained. By moving each node on the triangular mesh in accordance with the obtained shift amount, the triangular mesh is deformed in the configuration as shown in FIG. 6.

The method of the above oxidation calculation is described in detail in "Section 3 Simulation of Two Dimensional Oxidation, Chapter 2 Process Simulation, Volume 1 Process" (written by Seiichi Isomae) stated from pp.79 to pp.89 in a literature "Semiconductor Process Device Simulation Techniques" (published by Realize Co., 1990). The above-mentioned calculation simulation is executed following the flow chart of FIG. 4 on pp.85 of the above-mentioned literature.

The control volume deforming unit 15 is realized by a program-controlled CPU or the like, and deforms the control volume according to the shift correspondence to the deformation of the triangular mesh with respect to each node of the deformed triangular mesh. The deformed control volume is hereinafter called a deformed control volume.

Figure 5A:
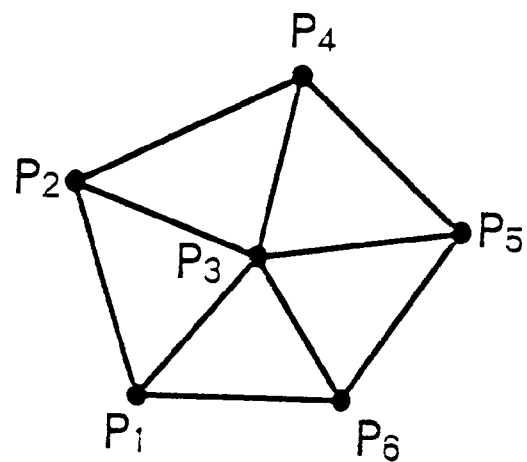
FIG. 5(A) is a view showing a pre-deformed triangular mesh, which guarantees the Delaunay partitioning, according to the first embodiment.
Figure 5B:
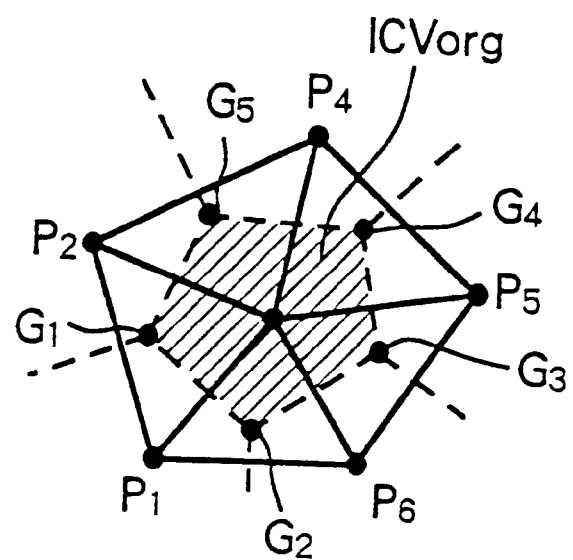
FIG. 5(B) is a view showing a pre-deformed control volume defined on a node of a pre-deformed triangular mesh, according to the first embodiment.

For example, the deformation of the control volume, which is caused by the oxidation, will be explained, by way of example, in the case where a triangle having the nodes P1 to P3 shown in FIG. 5 is deformed to the triangle having the nodes Q1 to Q3. In this case, the circumcenter G1 of the triangle having the nodes P1 to P3 shown in FIG. 5(B) is moved to the circumcenter H1 of the triangle having the nodes Q1 to Q3 shown in FIG. 6(B).

Here, assuming that the coordinate of the node P1 is (X1, Y1), the coordinate of the node P2 is (X2, Y2), the coordinate of the joint P3 is (X3, Y3), the coordinate of the joint Q1 is (X1', Y1'), the coordinate of the joint Q2 is (X2', Y2'), the coordinate of the joint Q3 is (X3', Y3'), and the coordinate of the circumcenter G1 (XG1, YG1) is linearly moved, the coordinate of the circumcenter H1 (XH1, YH1') is solved by $$XH1=X1'+(X2'-X1')S+(X3'-X2')ST \quad (5)$$
$$YH1=Y1'+(Y2'-Y1')S+(Y3'-Y2')ST \quad (6)$$

However, S and T in the formula (5) and the formula (6) are respectively solved by $$S=[(XG1-X1)(Y3-Y2)-(X3-X2)(YG1-Y1)]/[(X2-X1)(Y3-Y2)-(X3-X2)(Y2-Y1)] \quad (7)$$

$$T=[(X2-X1)(YG1-Y1)-(XG1-X1)(Y2-Y1)]/[(XG1-X1)(Y3-Y2)-(X3-X2)(YG1-Y1)] \quad (8)$$

The impurity concentration modifying unit 16 is realized by a program-controlled CPU or the like, and seeks the volume ratio of the pre-deformed control volume and its corresponding deformed control volume, to modify the impurity concentration of each node on the deformed triangular mesh on the basis of the obtained volume ratio and the impurity concentration of each joint on the pre-deformed triangular mesh.

Figure 6A:
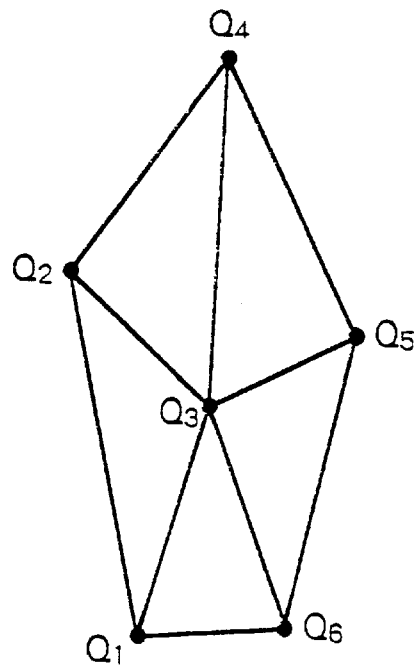
FIG. 6(A) is a view showing the triangular mesh deformed after the calculation of the oxidation process, according to the first embodiment.

For example, look at the case that assuming the pre-deformed control volume is ICV(org) and the deformed control volume is ICV(old), the volume ratio (ICV(org)/ICV(old)) is required, then to set the impurity concentration of the node Q3 in FIG. 6(A) on the basis of the volume ratio of the control volumes and the impurity concentration of each node on the pre-deformed triangular mesh. First, the impurity concentration of the joint P3 is obtained by multiplying the impurity concentration CP3 of the node P3 on the pre-deformed triangular mesh in FIG. 5(A) by the area of the pre-deformed control volume ICV(org). Then, the impurity concentration CQ3 of the joint Q3 on the deformed triangular mesh is obtained by dividing the calculated impurity amount by the area of the deformed control volume ICV(old). Namely, the impurity concentration CQ3 is obtained by the formula $$CQ3=CP3 \cdot ICV(org)/ICV(old) \quad (9)$$

Considering that the impurity concentration of each node on the triangular mesh is computed by multiplying the impurity concentration of each node on the pre-deformed triangular mesh by the volume ratio and the triangular mesh becomes larger than the pre-deformed triangular mesh, the impurity concentration of each node on the deformed triangular mesh is diluted as compared with the impurity concentration of each node on the pre-deformed triangular mesh.

The impurity concentration transferring unit 17 is realized by a program-controlled CPU or the like, and executes a graphic AND calculation of all of the deformed control volumes and new control volumes, then to calculate the region where the deformed control volumes and new control volumes overlap. Then, the number of the impurity of each calculated region is calculated, the total number of the impurity in the region is divided by the area of the new control volume, and the obtained value is set as the impurity concentration of each node on the new triangular mesh. By doing this, the amount of the impurity included in the deformed control volume of the region where the deformed control volume and the new control volume overlap each other is transferred to the new control volume. The process by the impurity transferring unit 17 will be explained in detail later.

The diffusion calculation unit 18 executes the diffusion calculation for solving the diffusion of the impurity in an oxidizing atmosphere by the use of the new triangular mesh and the new control volume finally obtained through the process of each processing unit mentioned above.

Figure 2:
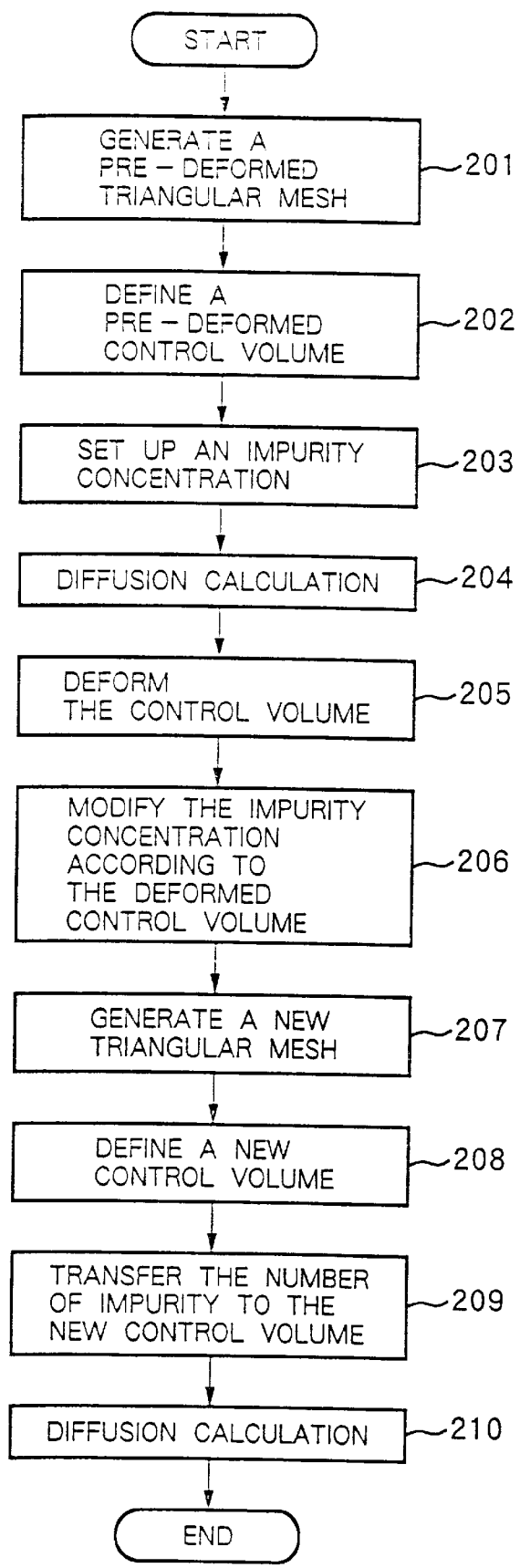
FIG. 2 is a flow chart showing an operation according to the first embodiment.
Figure 3:
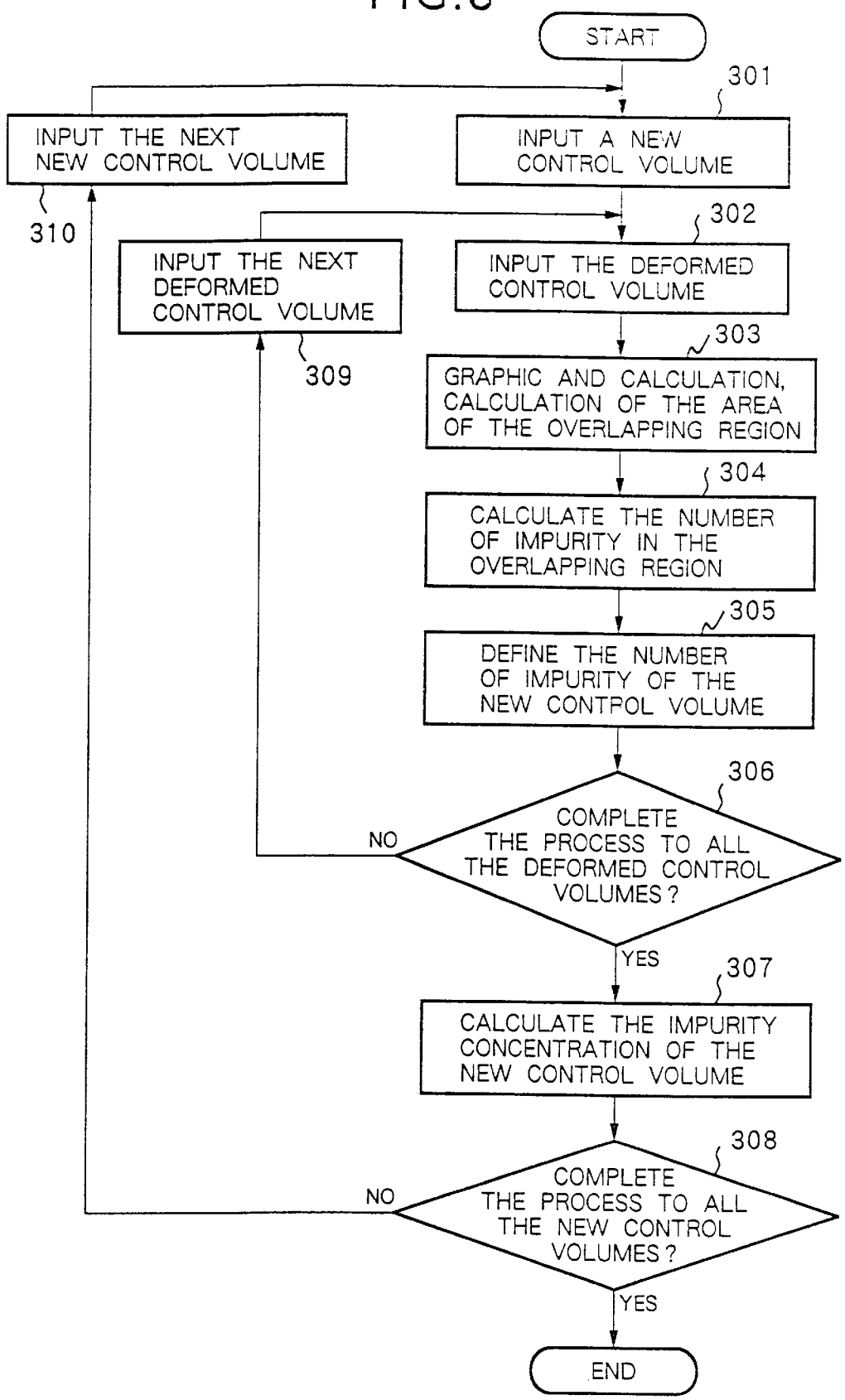
FIG. 3 is a flow chart showing an operation of an impurity concentration transferring unit according to the first embodiment.

This time, an operation of this embodiment will be described with reference to the flow charts of FIGS. 2 and 3. FIG. 2 shows the flow from the processing of generating an oxidation mesh to the processing of performing a diffusion calculation. FIG. 3 shows the flow of an operation in the impurity concentration transferring unit 17.

Referring to FIG. 2, the triangular mesh generating unit 11 generates a triangular mesh (a pre-deformed triangular mesh), which guarantees the Delaunay partitioning to the initial configuration of the semiconductor device to be processed (Step 201). The control volume defining unit 12 defines a control volume (a pre-deformed control volume) to the generated pre-deformed triangular mesh (Step 202). The impurity concentration setting unit 13 sets up the concentration of the impurity introduced by the ion implantation to the initial configuration of the semiconductor device (Step 203). As mentioned above, setting has been completed to the pre-deformed semiconductor device before the calculation of the oxidation.

The oxidation calculating unit 14 analyzes the change in the configuration due to the oxidation by performing the oxidation calculation, and deforms the configuration of the semiconductor device as well as the triangular mesh, thereby to form a deformed triangular mesh (Step 204). The control volume deforming unit 15 deforms the control volume according to the deformation of the triangular mesh, thereby to form a deformed control volume (Step 205 in FIG. 1). The impurity concentration modifying unit 16 seeks the volume ratio of the pre-deformed control volume and its corresponding deformed control volume and sets up the impurity concentration at each node on the deformed triangular mesh on the basis of the obtained volume ratio and the impurity concentration at each node on the predetermined triangular mesh (Step 206). In this way, deformation of the semiconductor device due to the oxidation and its setting amendment have been completed.

This time, resetting is performed to the deformed semiconductor device. First, the triangular mesh generating unit 11 newly generates a triangular mesh (a new triangular mesh), which guarantees the Delaunay partitioning to the deformed configuration of the semiconductor device (Step 207). The control volume defining unit 12 once more defines the control volume (new control volume) for every node of the new triangular mesh (Step 208).

The impurity concentration transferring unit 17 transfers the value of the impurity concentration to the new control volume (Step 209). More specifically, a graphic AND calculation of all the deformed control volumes and new control volumes is performed, to compute the regions where the deformed control volumes and new control volumes overlap each other. The number of impurity in each computed region is calculated and the total number thereof is divided by the area of the new control volume. The obtained value is set up as the impurity concentration of each node on the new triangular mesh. As mentioned above, appropriate setting to the semiconductor device deformed by the oxidation has been completed.

At last, the diffusion calculating unit 18 performs a diffusion calculation by the use of the new triangular mesh and new control volume set up through the processing of each step as mentioned above (Step 210).

FIG. 3 is a flow chart showing in detail the content of the processing operation by the impurity concentration transferring unit 17, which is indicated by Step 209 of FIG. 2.

When receiving the new control volume ICV(new) from the control volume defining unit 12 (Step 301), the impurity concentration transferring unit 17 is provided with the deformed control volume ICV(old) corresponding to the new control volume ICV(new) from the control volume deformation unit 15 (Step 302). A graphic AND calculation of the new control volume ICV(new) and the deformed control volume ICV(old) is performed, then to require the area S(and) where the new control volume ICV(new) and the deformed control volume ICV(old) overlap each other (Step 303).

The required area S(and) is multiplied by the impurity concentration defined again by the impurity concentration modifying unit 16, to calculate the number of impurity D (and) in the region where the new control volume ICV(new) and the deformed control volume ICV(old) overlap each other (Step 304). Each of the number of impurity D (and) resulted from the calculation is added one after another, to define the total as the number of impurity D (new) in the new control volume ICV(new) (Step 305).

Next, it is checked whether the processing from Step 303 to Step 305 as mentioned above is performed on all the deformed volumes ICV(old) overlapping the new control volumes (new) (Step 306). If it is not performed on all the deformed control volumes ICV(old), the next deformed control volume ICV(old) is picked up to take the processing from Step 303 to Step 305 (Step 309).

If the processing from Step 303 to Step 305 as mentioned above is performed on all the deformed control volumes ICV(old), the total amount of impurity totalized by the respective number of impurity D (and) in all the regions where the deformed control volumes ICV(old) overlap with the new control volumes ICV(new), namely, the total amount of impurity in the overlapping region is divided by the area of the new control volumes ICV(new) and the calculation result is set up as impurity concentration at the joints defining the new control volume ICV(new) (Step 307).

This time, it is checked whether the processing from Step 302 to Step 307 and Step 309 is performed on all the new control volumes ICV(new) (Step 308). If it is not performed on all the new control volumes ICV(new), the next new control volume ICV(new) is picked up to take the processing from Step 302 to Step 307 and Step 309 (Step 310).

By the above-mentioned operation, the impurity concentration of the new control volume is set up with respect to each node of the new triangular mesh arranged on the deformed semiconductor device.

Figure 8:
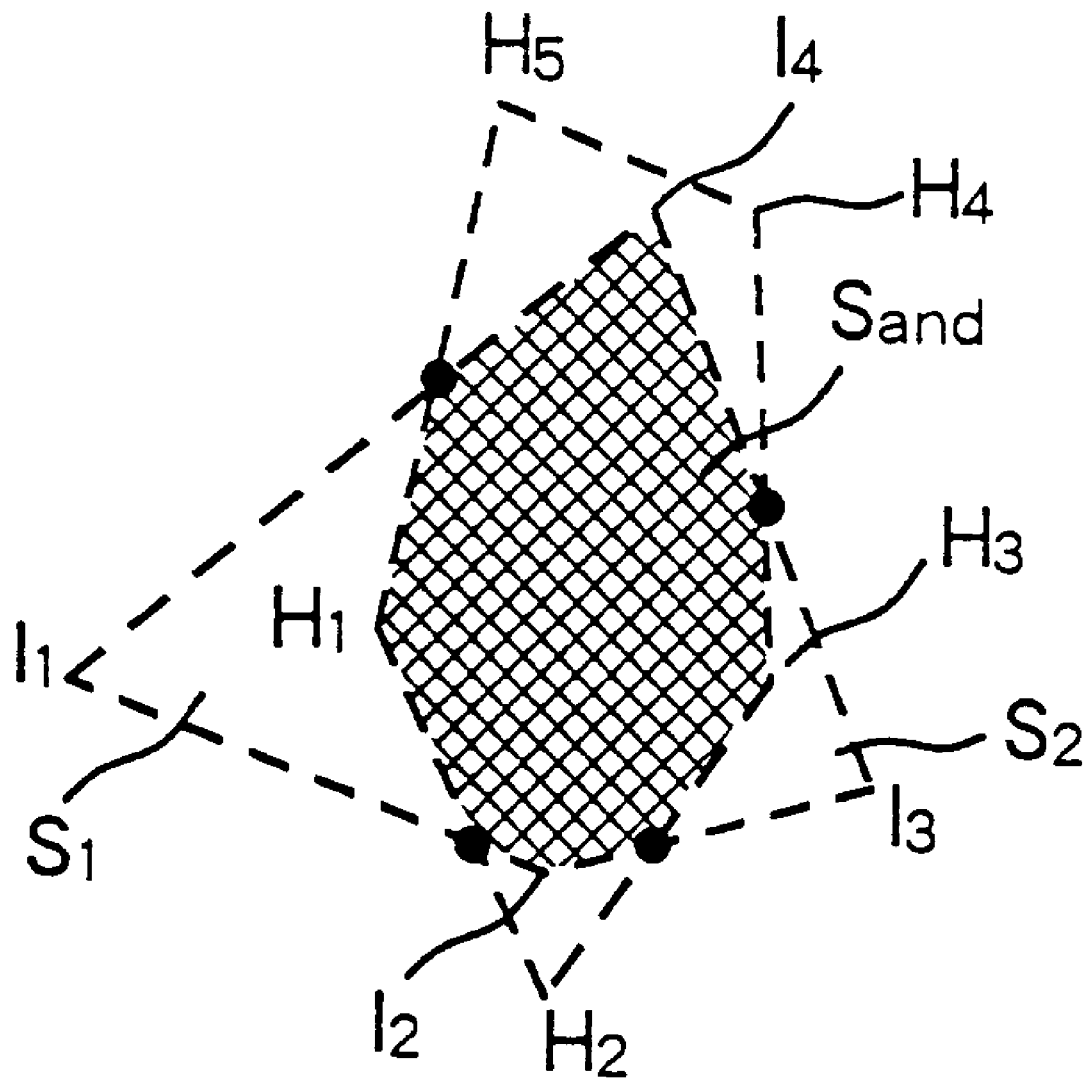
FIG. 8 is a view showing a graphic AND calculation of the new control volume and the deformed control volume, according to the first embodiment.

Referring to FIGS. 5 and 8, a function of the present embodiment will be described specifically.

Figure 6B:
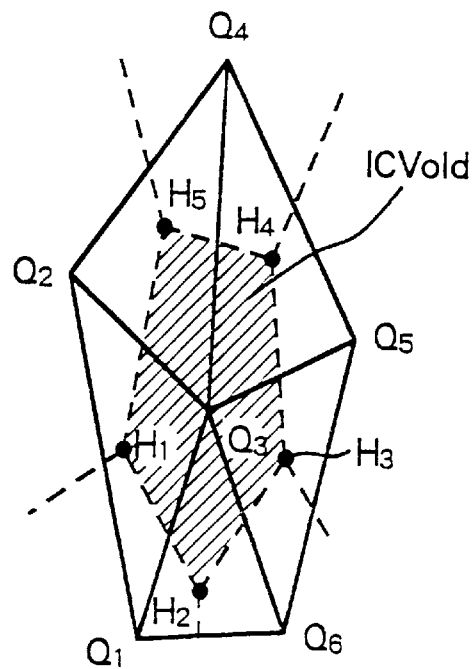
FIG. 6(B) is a view showing a deformed control volume defined on a node of the deformed triangular mesh, according to the first embodiment.
Figure 7A:
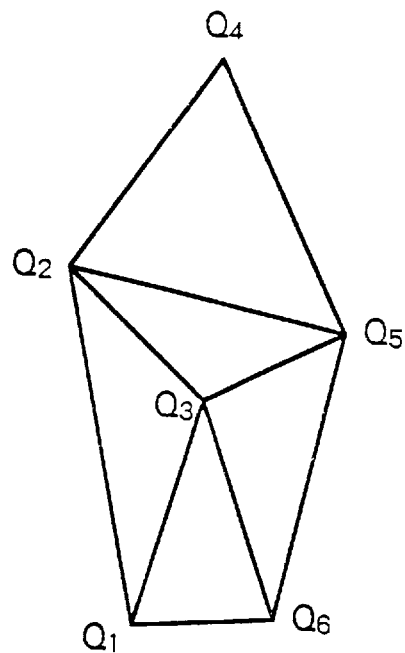
FIG. 7(A) is a view showing a new triangular mesh, which guarantees the Delaunay partitioning to the deformed semiconductor device after the calculation of the oxidation process, according to the first embodiment.
Figure 7B:
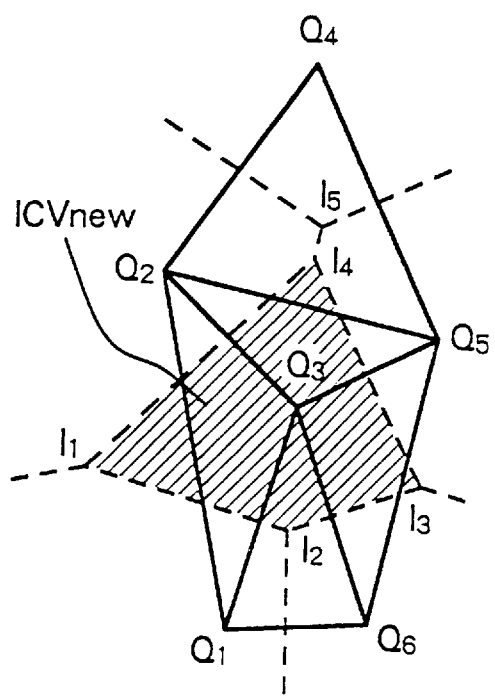
FIG. 7(B) is a view showing a new control volume defined on a node of the new triangular mesh, according to the first embodiment.

FIG. 5(A) is a view showing a pre-deformed triangular mesh, which guarantees the Delaunay partitioning. FIG. 5(B) is a view showing a pre-deformed control volume defined on a node of the pre-deformed triangular mesh. FIG. 6(A) is a view showing a deformed triangular mesh after the calculation of the oxidation process. FIG. 6(B) is a view showing a deformed control volume defined on a node of the deformed triangular mesh. FIG. 7(A) is a view showing a new triangular mesh, which guarantees the Delaunay partitioning to the semiconductor device deformed after the calculation of the oxidation process. FIG. 7(B) is a view showing a new control volume defined on a node of the new triangular mesh. FIG. 8 is a view showing a graphic AND calculation of the new control volume and the deformed control volume.

Assume that the triangular mesh generating unit 11 has generated a pre-deformed triangular mesh, which guarantees the Delaunay partitioning and has the nodes P1 to P6 to the initial configuration of the semiconductor device, as indicated in FIG. 5(A). As illustrated in the drawing, the pre-deformed triangular mesh includes a triangular mesh consisting of the nodes P1 to P3, a triangular mesh consisting of the nodes P2 to P4, a triangular mesh consisting of the nodes P3 to P5, a triangular mesh consisting of the nodes P3, P5 and P6, and a triangular mesh consisting of the nodes P1, P3 and P6. Hereinafter, deformation of the triangular mesh and its processing will be explained by way of example of a control volume defined with respect to the node P3.

The control volume defining unit 12 defines a pre-deformed control volume ICV(org) on the node P3 of the pre-deformed triangular mesh as shown in FIG. 5(B). In other words, the region formed by connecting the respective circumcenters G1 to G5 of the triangles having the node P3 in common is defined as a pre-deformed control volume ICV(org). The impurity concentration setting unit 13 sets up the concentration of the impurity introduced to the initial configuration of the semiconductor device by the ion implantation or the like, with respect to the node P3 where the pre-deformed control volume ICV(org) has been defined.

The oxidation calculating unit 14 analyzes the change in the configuration due to the oxidation by performing an oxidation calculation, and predicts the final configuration of the semiconductor device and the changes of the impurity profile according to the time passing, so that the configuration of the semiconductor device and the triangular mesh are deformed as shown in FIG. 6(A). In this case, the respective nodes P1 to P6 of the pre-deformed triangular mesh move to the respective nodes Q1 to Q6 according to the shift of the coordinates as shown in the drawing.

The control volume deformation unit 15 defines a deformed control volume with respect to the node Q3 of the deformed triangular mesh as indicated in FIG. 6(B). Namely, the region formed by connecting the respective circumcenters H1 to H6 of the triangles having the joint Q3 in common is defined as a deformed control volume ICV(old). For example, when a triangle consisting of the nodes P1 to P3 indicated in FIG. 5(A) is deformed to a triangle consisting of the nodes Q1 to Q3 indicated in FIG. 6(A), the circumcenter G1 of the triangle consisting of the nodes P1 to P3 indicated in FIG. 5(B) is shifted to the circumcenter H1 of the triangle consisting of the nodes Q1 to Q3 indicated in FIG. 6(B). The position where the circumcenter is shifted can be calculated by the use of the above mentioned formulae (5) and (6).

The impurity concentration modifying unit 16 seeks the volume ratio of the pre-deformed control volume ICV(org) and the deformed control volume ICV(old), and on the basis of the resultant volume ratio and the impurity concentration at each node on the pre-deformed triangular mesh, the unit 16 sets up the impurity concentration at each node Q1 to Q6 on the deformed triangular mesh by the use of the above mentioned formula (9).

The triangular mesh generating unit 11, as indicated in FIG. 7(A), once more generates a new triangular mesh that guarantees the Delaunay partitioning and has the nodes Q1 to Q6 to the configuration of the semiconductor device deformed by the oxidation. As indicated in the drawing, the new triangular mesh includes a triangular mesh consisting of the nodes Q1 to Q3, a triangular mesh consisting of the nodes Q2, Q3 and Q5, a triangular mesh consisting of the nodes Q2, Q4 and Q5, a triangular mesh consisting of the nodes Q3, Q5 and Q6, and a triangular mesh consisting of the nodes Q1, Q3 and Q6.

The control volume defining unit 12 sets up a new control volume ICV(new) on the node Q3 of the new triangular mesh, as indicated in FIG. 7(B).

The impurity concentration transferring unit 17 performs a graphic AND calculation of the deformed control volume ICV(old) and the new control volume ICV(new), and as indicated in FIG. 8, computes the area S(and) of the region where the deformed control volume ICV(old) and the new control volume ICV(new) overlap each other. Here, as for the regions S1 and S2 where they don't overlap each other, alternatively, they may be computed as the overlapping region in relation to the other deformed control volume ICV(old).

The graphic AND calculation of the deformed control volume ICV(old) and the new control volume ICV(new) will be performed as follows. First, intersections of the deformed control volume ICV(old) and the new control volume ICV(new) are sought. Then, with respect to each of the circumcenters H1 to H5 of the deformed control volume ICV(old), it is checked whether it is located within the region of the new control volume ICV(new). While, with respect to each of the circumcenters I1 to I4 of the new control volume ICV(new), it is checked whether it is located within the region of the deformed control volume ICV(old). The intersections of the both control volumes and the circumcenters judged to be mutually inner of the control volumes (in the example of FIG. 8, the circumcenters H1, H3, I2 and I4) are connected so as to require the AND region and compute the area.

On the basis of the areas S(and), S1 and S2 of the computed regions, the number of impurity is calculated and each number of impurity in the regions is added one after another, to compute the total amount. The value resulted from dividing the total amount of the impurity by the area of the new control volume ICV(new) is set up as the impurity concentration at a node on the new triangular mesh.

The impurity concentration of the new control volume is thus set up, which is used for a diffusion calculation by the diffusion calculating unit 18 together with the new triangular mesh. Owing to this, in the process simulation of oxidation/diffusion, even if a triangular division is performed once more so as to guarantee the Delaunay partitioning to the deformed configuration, the total dose amount of impurity before deformation of the oxidation can be reserved, when the configuration of the semiconductor device varies because of the oxidation. This is why the dose amount in the overlapping region of the new control volume ICV(new) and the deformed control volume ICV(old) can be delivered to the new control volume ICV(new) by performing a graphic AND calculation of the new control volume ICV(new) and the deformed control volume ICV(old).

Here, in this embodiment shown in the flow chart of FIG. 3, the processing shall be performed repeatedly with respect to all of the new control volumes ICV(new) and deformed control volumes ICV(old). In this processing method, however, if the number of the control volumes is supposed to be "n", algorithm has the order "O($n^2$)" of "n"', taking much computing time. The use of the hash table method enables to realize the speed-up in such a way as roughly dividing the configuration of the semiconductor device into rectangular regions of appropriate size beforehand so as to perform the processing like an AND calculation with respect to only the new control volume and the deformed control volume included in a rectangular region.

Figure 9:
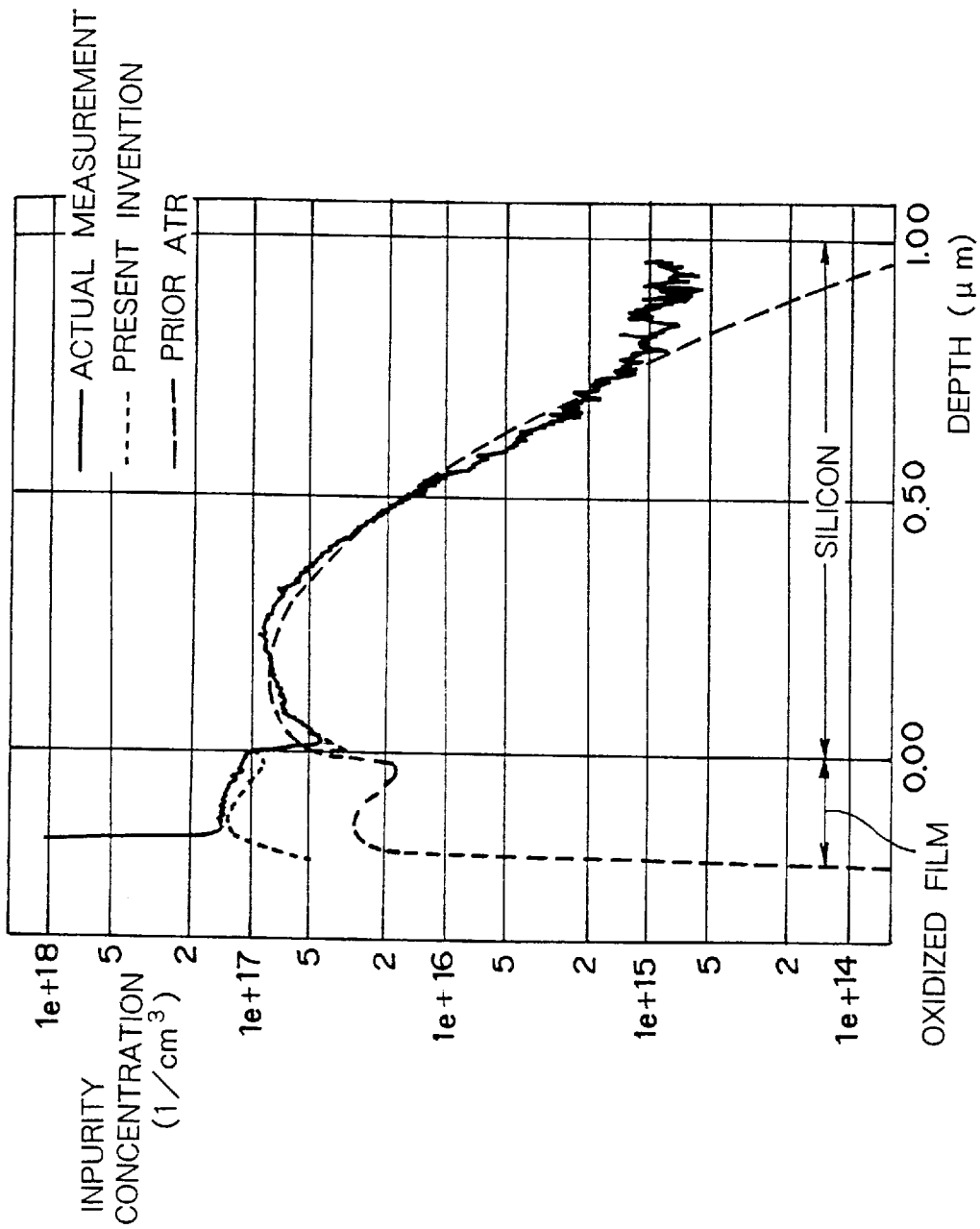
FIG. 9 shows a comparison of the profile according to the first embodiment and the results obtained from an actual measurement.

FIG. 9 is a view showing a comparison of the profile according to this embodiment and the result obtained from an actually measurement. About the case where ion implantation is applied to Boron from the surface of Si at the energy of 50 KeV and at the dose amount of $5E10^{12}$ cm$^{-2}$, and then thermal oxidation is further applied there at the oxidation temperature of 900° C. for 30 minutes, FIG. 9 shows a comparison between the impurity profile simulated by the use of this embodiment, the impurity profile simulated by the use of the prior art, and the actual value measured with the secondary ion mass spectroscopy (SIMS).

Referring to FIG. 9, the simulation result by this embodiment is in good accord with the actual result by the secondary ion mass spectroscopy in the both portions of Si and oxidized film. The simulation result by the prior art, however, shows the impurity concentration about one fifth as high as the actual result by the secondary ion mass spectroscopy, in the portion of the oxidized film, which is a serious error. In the actual result by the secondary ion mass spectroscopy, the increase in impurity in the vicinity of the surface of the oxidized film is due to the measurement error resulted from the matrix effect caused by the oxygen adhering to the surface, and the decrease in the bottom portion on the side of Si is due to the error caused by the influence of the background.

The integral amount (dose amount) of the impurity distribution obtained by the simulation according to this embodiment becomes $5E10^{12}$ cm$^{-2}$ as the result of calculation, which is in accord with the dose amount of the ion implantation $5E10^{12}$ cm$^{-2}$. However, the integral amount (dose amount) of the impurity distribution obtained by the simulation according to the prior art becomes $3E10^{12}$ cm$^{-2}$ as a result of calculation, which is out of accord with the dose amount of the ion implantation $5E10^{12}$ cm$^{-2}$.

As mentioned above, the present embodiment can obtain a preferable simulation result compared with the prior art.

Next, the second embodiment of the present invention will be described.

A process simulation of the second embodiment has the same composition as that of the first embodiment shown in FIG. 1, so that the description thereof is omitted.

Figure 10:
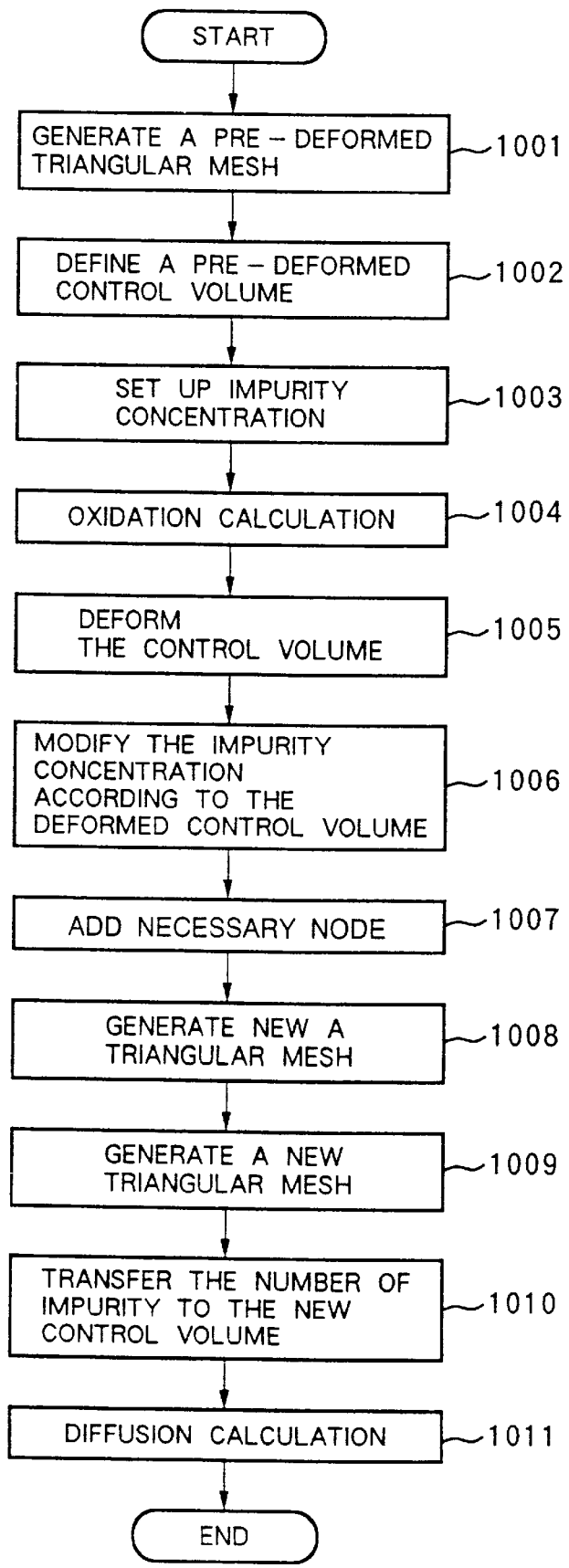
FIG. 10 is a flow chart showing an operation of a process simulator according to a second embodiment of the invention.

FIG. 10 is a flow chart showing an operation of the process simulation according to the second embodiment of the present invention.

Of the whole processing operation according to this embodiment, the operation from the processing of generating the pre-deformed triangular mesh to the initial configuration of the semiconductor device (Step 1001) to the processing of setting up the impurity concentration modified according to the deformed control volume (Step 1006) conforms with the operation from Step 201 to Step 206 of the first embodiment. Therefore, the explanation of the operation from Steps 1001 to 1006 is omitted here, and the operation after Step 1007 will be described hereinafter.

The triangular mesh generating unit 11 allocates nodes for generating a triangular mesh to the configuration of the semiconductor device deformed by the oxidation. At this time, a node is added so as to satisfy the predetermined condition (Step 1007). More specifically, the allocating condition of the nodes is determined so that the difference of the impurity concentration between the adjacent nodes could be within one figure, and according to this condition, a node shall be added to a place where the impurity concentration defined again to the deformed control volume varies extremely.

The triangular mesh generating unit 11 generates a new triangular mesh on the basis of the nodes that have been allocated again after adding a proper node (Step 1008). The control volume defining unit 12 once again defines a new control volume to the new triangular mesh (Step 1009), and the impurity concentration transferring unit 17 transfers the value of the impurity concentration to the new control volume (Step 1010). The operation from Steps 1008 to 1010 is in accordance with the operation from Steps 207 to 209 of the first embodiment indicated in FIG. 2.

At last, the diffusion calculating unit 18 performs a diffusion calculation by the use of the new triangular mesh and new control volume set up through the processing of the respective steps as mentioned above (Step 1011).

A function of the second embodiment will be explained in detail with reference to FIGS. 11 and 12.

Figure 11A:
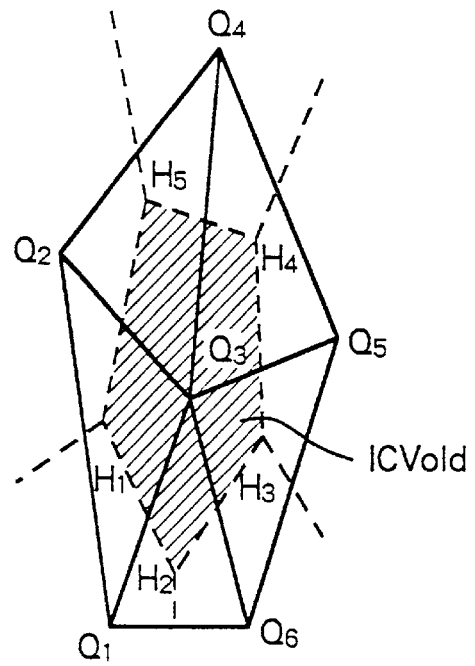
FIG. 11(A) is a view showing a deformed control volume defined on a node of the triangular mesh deformed after the calculation of the oxidation process, according to the second embodiment.
Figure 11B:
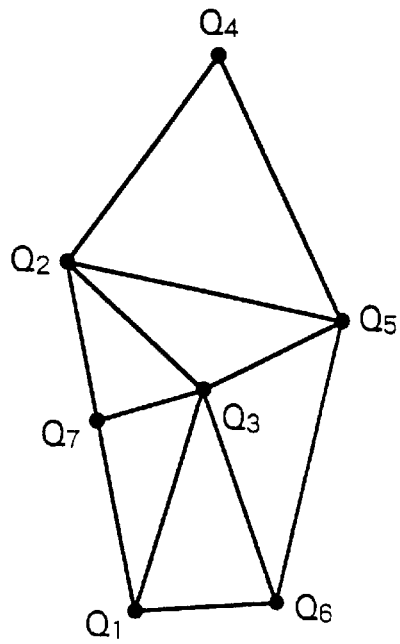
FIG. 11(B) is a view showing a new triangular mesh, which guarantees the Delaunay partitioning to the semiconductor device deformed after the calculation of the oxidation process, according to the second embodiment.
Figure 11C:
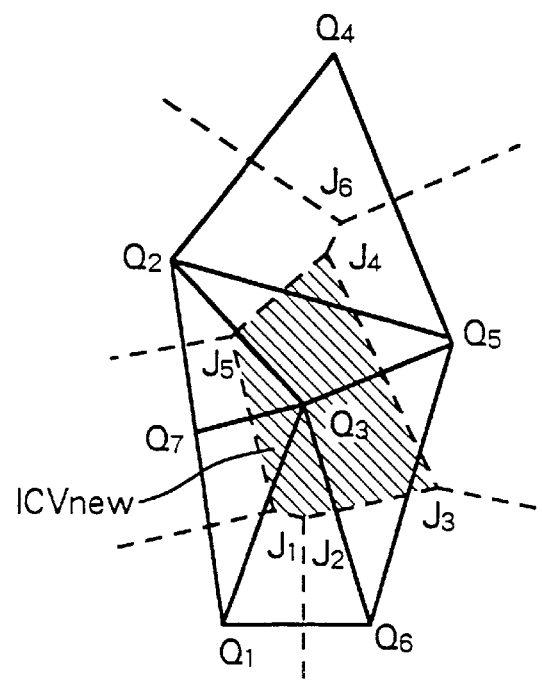
FIG. 11(C) is a view showing a new control volume defined on a node of the new triangular mesh, according to the second embodiment.
Figure 12:
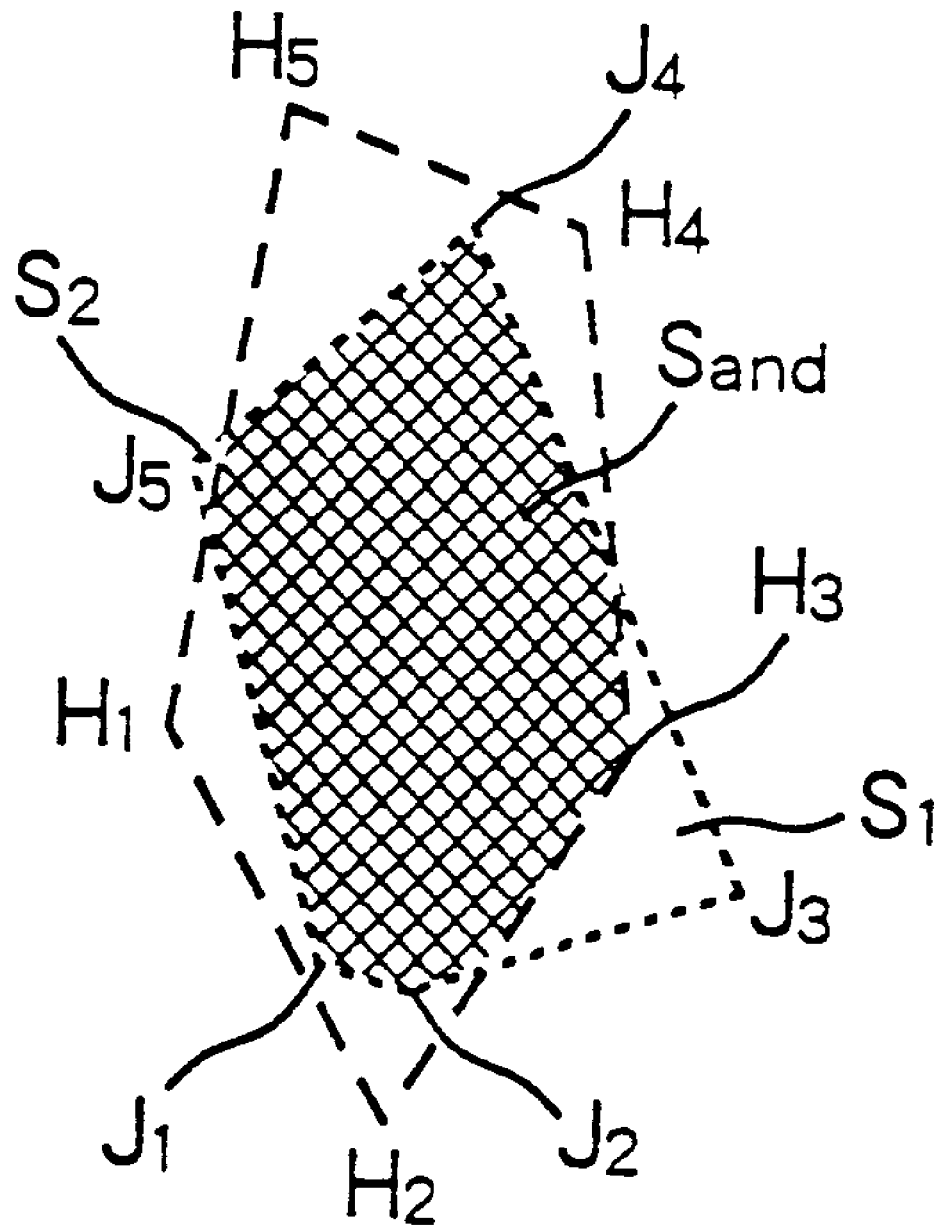
FIG. 12 is a view showing a graphic AND calculation of a new control volume and a deformed control volume, according to the second embodiment.
Figure 13:
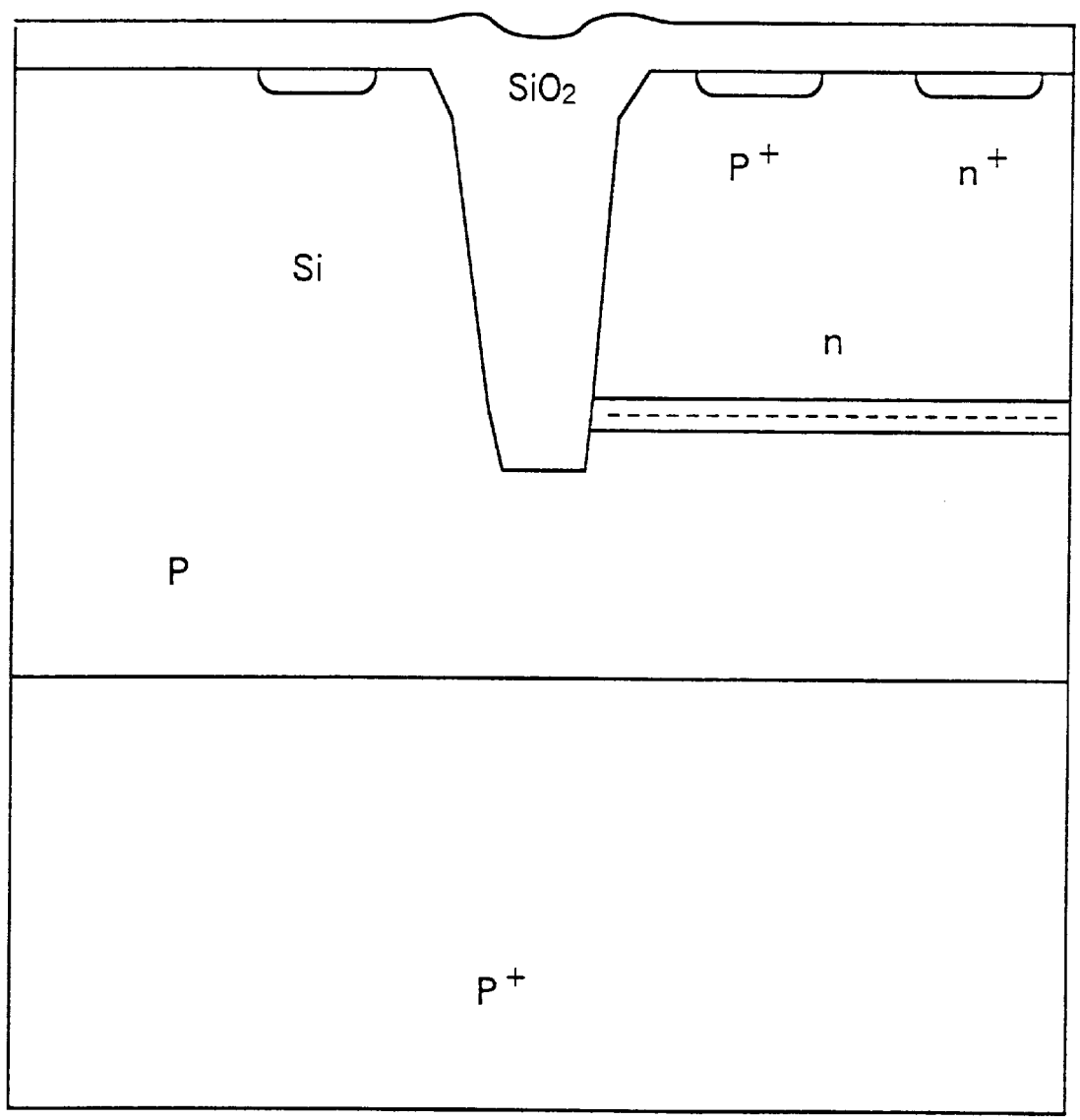
FIG. 13 is a schematic view showing a sectional configuration of the semiconductor device.
Figure 14:
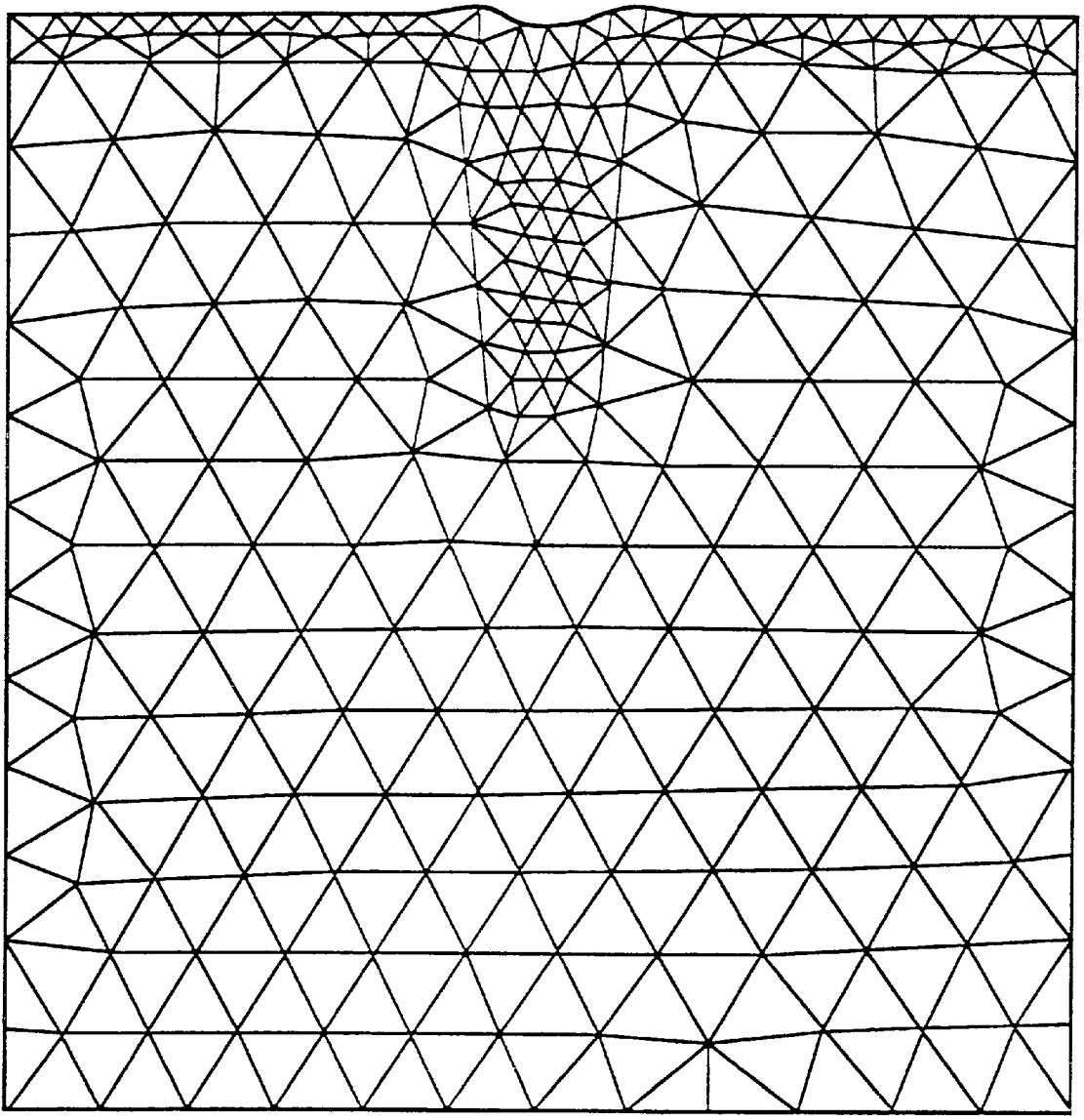
FIG. 14 is a view showing an example of a triangular mesh applied to the section of the semiconductor device of FIG. 13.
Figure 15:
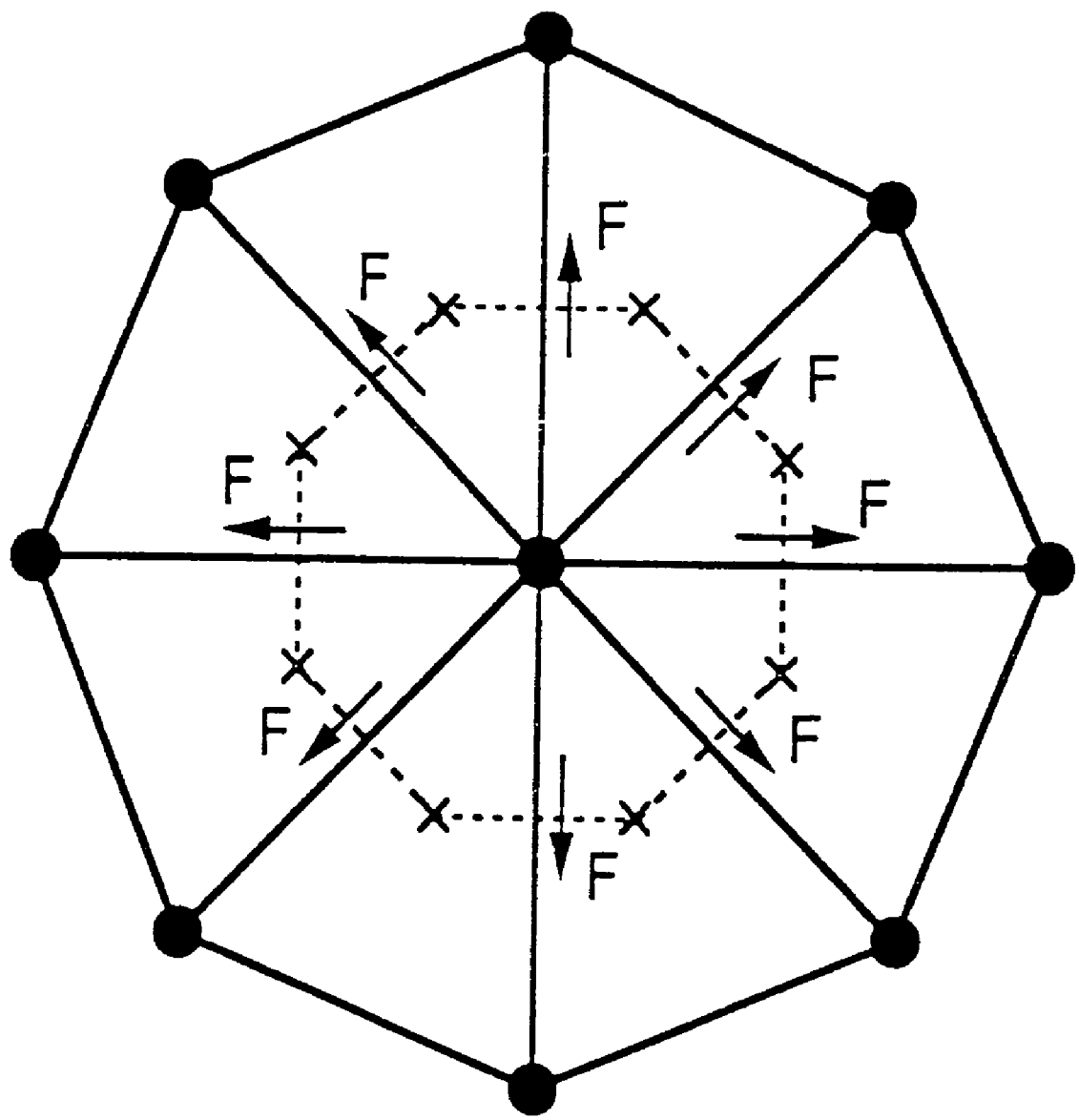
FIG. 15 is a view showing an impurity flux and its integral region in the triangle mesh.
Figure 16:
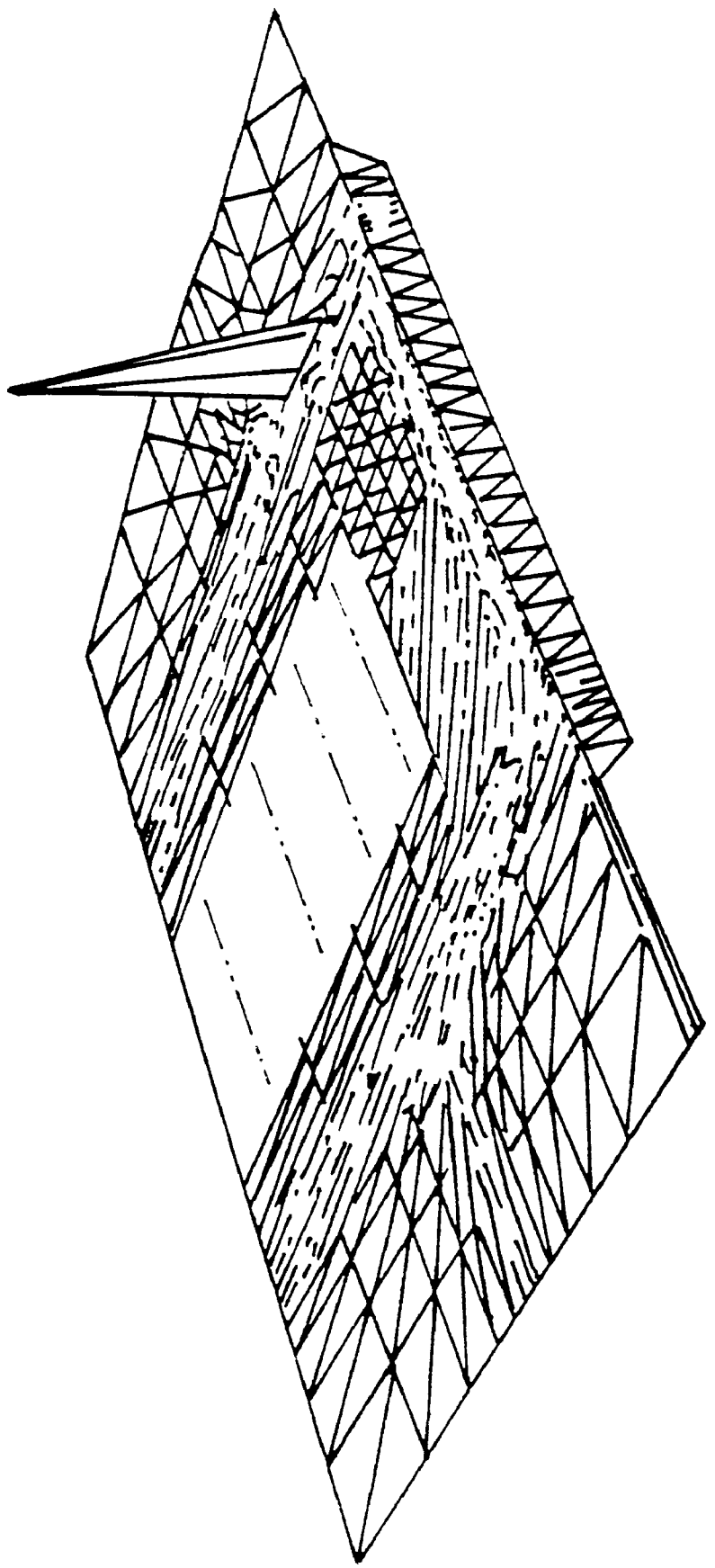
FIG. 16 is a view showing an incorrect result of simulation by the conventional technique of the process simulation.
Figure 17A:
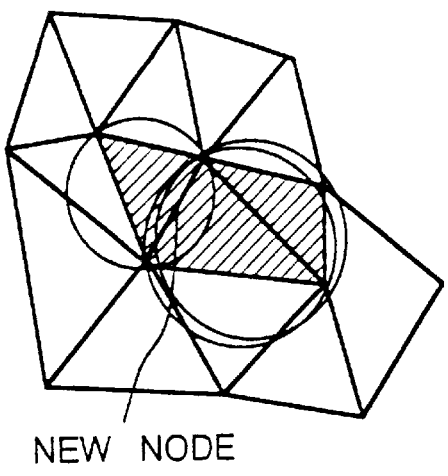
FIG. 17(A) is a view showing an execution process of the Delaunay partitioning, and it also shows a process of searching triangles having circumscribed circles including a new joint.
Figure 17B:
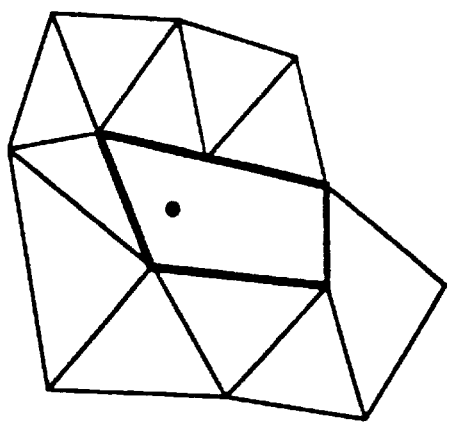
FIG. 17(B) is a view showing an execution process of the Delaunay partitioning, and it also shows a process of deleting triangles that have been searched.
Figure 17C:
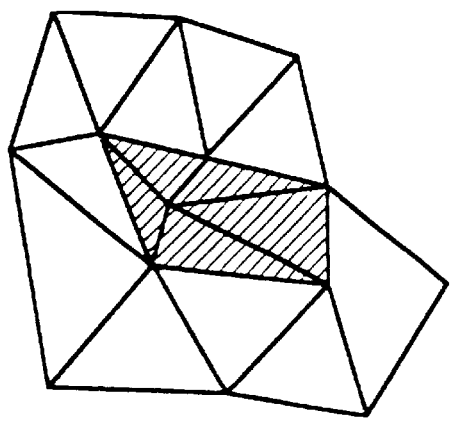
FIG. 17(C) is a view showing an execution process of the Delaunay partitioning, and it also shows a process of making new triangles that guarantee the Delaunay partitioning.

FIGS. 11 and 12 are views showing the procedure of the process simulation according to the second embodiment, by way of example, in the case where the process simulation of the second embodiment is executed to the pre-deformed triangular mesh of FIG. 5 explained in the first embodiment.

FIG. 11(A) is a view showing a deformed control volume defined on a node of the deformed triangular mesh, in the same condition as FIG. 6(B). FIG. 11(B) is a view showing a new triangular mesh that guarantees the Delaunay partitioning to the semiconductor device deformed after the calculation of the oxidation process. FIG. 11(C) is a view showing a new control volume defined on a node of the new triangular mesh. FIG. 12 is a view showing a graphic AND calculation of the new control volume and the deformed control volume. The processing to the deformation of the semiconductor device through the oxidation process of the second embodiment is similar to that of the first embodiment, thereby omitting its explanation. The processing from the definition of a deformed control volume on a node of the deformed triangular mesh will be explained hereinafter.

When the oxidation calculation unit 14 deforms the triangular mesh, the control volume deforming unit 15 defines a deformed control volume with respect to the node Q3 of the deformed triangular mesh, as illustrated in FIG. 11(A). In other words, the region surrounded by connecting the circumcenters H1 to H5 of each triangle having the node Q3 in common is defined as a pre-deformed control volume (org). The impurity concentration modifying unit 16 seeks the volume ratio of the predeformed control volume ICV (org) and the deformed control volume ICV(old), and sets up the impurity concentration at each node Q1 to Q6 on the deformed triangular mesh on the basis of each of the obtained volume ratio and the impurity concentration at each node on the pre-deformed triangular mesh.

The triangular mesh generating unit 11 once more generates a new triangular mesh, which guarantees the Delaunay partitioning and has the nodes Q1 to Q7, to the configuration of the semiconductor device deformed by the oxidation, as indicated in FIG. 11(B). Here, the node Q7 is a node newly added between the nodes Q1 and Q2 so as to satisfy such a condition that the difference of the impurity concentration between all the nodes Q1 to Q6 should be within one figure, after setting the respective impurity concentration at the nodes Q1 to Q6. More specifically, if the difference of the impurity concentration between the nodes Q1 and Q2 is in two figures or over, the triangular mesh generating unit 11 adds the node Q7 in the middle of the line connecting the nodes Q1 and Q2. After adding the joint Q7, the unit 11 generates a new triangular mesh. As illustrated in the drawing, the new triangular mesh includes a triangular mesh consisting of the nodes Q1, Q3 and Q7, a triangular mesh consisting of the nodes Q2, Q3 and Q5, a triangular mesh consisting of the nodes Q2, Q3 and Q7, a triangular mesh consisting of the nodes Q2, Q4 and Q5, a triangular mesh consisting of the nodes Q3, Q5 and Q6, and a triangular mesh consisting of the nodes Q1, Q3 and Q6.

This time, the control volume defining unit 12 sets up a new control volume ICV(new) on the node Q3 of the new triangular mesh, as indicated in FIG. 11(C).

The impurity concentration transferring unit 17 performs a graphic AND calculation of the deformed control volume ICV(old) and the new control volume ICV(new) and computes the area S of the region where the deformed control volume ICV(old) and the new control volume ICV(new) overlap each other as illustrated in FIG. 12. With respect to the regions S1 and S2 where they don't overlap each other in this processing, alternatively, their areas are computed as the overlapping regions in the relation to the other deformed control volume ICV(old).

The number of impurity is respectively calculated on the basis of the area S(and), S1, S2 of the computed regions, each of the number of impurity in the regions is added one after another to require the total amount. The value obtained by dividing the total amount of the impurity by the area of the new control volumes ICV(new) is set up as the impurity concentration at each node on the new triangular mesh.

The impurity concentration of the new control volume ICV(new) is thus set up and used for a diffusion calculation by the diffusion calculating unit 18 together with the new triangular mesh, similarly to the first embodiment.

Analytical accuracy in solving the diffusion equation depends on the discrete error in making the configuration of the semiconductor discrete by the use of triangles. According to the second embodiment of the present invention, the node Q7 is added so as to make the difference of the impurity concentration between the adjacent nodes within the predetermined value (for example, within one figure), thereby improving the analytical accuracy and suppressing the discrete error compared with the first embodiment.

Similarly to the first embodiment, the use of hash table method can realize the speed-up, in such a way of roughly dividing the configuration of the semiconductor into rectangular regions of appropriate size beforehand, and performing an AND calculation of only the new and deformed control volumes included in the respective rectangular regions, without the repetition of the process to all the new control volumes ICV(new) and deformed control volumes ICV(old).

As set forth hereinabove, according to the process simulator of the present invention, even in the case where the configuration of the semiconductor device to be processed varies by the oxidation, a triangular division can be performed to the deformed configuration so as to guarantee the Delaunay partitioning, and the total dose amount of the impurity before the deformation due to the oxidation can be reserved.

According to the present invention, even in the case where the configuration varies by the oxidation, when a triangular division is performed so as to guarantee the Delaunay partitioning to the deformed configuration of the device, a node can be newly set up, if necessary, on the basis of the impurity concentration at a node on the triangular mesh deformed by the oxidation, and the discrete error can be suppressed, thereby improving the analytical accuracy.

According to the present invention, in the case where a new node is set up in generating a triangular mesh again, the value of the impurity concentration set up to the control volume of the corresponding pre-deformed triangular mesh can be transferred to the control volume of the triangular mesh newly generated, thereby saving a trouble of setting up the impurity concentration at the corresponding node once more.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments that can be embodied within the scope encompassed by the appended claims and equivalents thereof

What is claimed is:

1. A process simulator for calculating an internal physical quantity inside a semiconductor by dividing the semiconductor to be processed into smaller triangular regions and solving partial differential equations analytically, comprising:

a triangular mesh generating means for generating a triangular mesh, which guarantees the Delaunay partitioning, on the semiconductor device to be processed, at least two times, in the initial stage and after deformation due to an oxidation calculation;

a control volume defining means for defining a control volume to the triangular mesh generated by said triangular mesh generating means;

an impurity concentration setting means for setting up an impurity concentration to the control volume defined by said control volume defining means;

an oxidation calculating means for calculating an oxidation process of the semiconductor device and deforming the triangular mesh;

a control volume deforming means for deforming the control volume according to the triangular mesh deformed by the oxidation calculation;

an impurity concentration modifying means for modifying the impurity concentration set by said impurity concentration setting means according to the control volume deformed by said control volume deforming means;

an impurity concentration transferring means for transferring the impurity concentration modified by said impurity concentration modifying means to the control volume defined on the triangular mesh newly generated to the semiconductor device deformed by the oxidation calculation; and a diffusion calculating means for performing a diffusion calculation according to the finally determined triangular mesh, control volume, and impurity concentration.

2. A process simulator as set forth in claim 1, wherein said impurity concentration transferring means seeks the region where the control volume deformed by said control volume deforming means and the control volume defined on the triangular mesh newly generated to the semiconductor device deformed by said triangular mesh generating means overlap each other, calculates the number of the impurity in the overlapping region, sets up the value obtained by dividing the total amount of the impurity in the overlapping region by the area of the control volume defined on the triangular mesh newly generated as the impurity concentration of each joint on the triangular mesh newly generated.

3. A process simulator as set forth in claim 2, wherein in the case of seeking the region where the control volume deformed by said control volume deforming means and the control volume defined on the triangular mesh newly generated to the semiconductor device deformed by said triangular mesh generating means overlap each other, said impurity concentration transferring means roughly divides the configuration of the semiconductor device into rectangular regions of appropriate size beforehand and seeks the overlapping region of the both control volumes only included in the rectangular region.

4. A process simulator as set forth in claim 1, wherein said triangular mesh generating means generates the triangular mesh by setting a new node if necessary, when newly generating the triangular mesh, which guarantees the Delaunay partitioning to the semiconductor device deformed by the oxidation calculation.

5. A process simulator as set forth in claim 1, wherein said triangular mesh generating means generates the triangular mesh by setting a new node at a place where the impurity concentration modified by said impurity concentration modifying means varies extremely, when newly generating the triangular mesh, which guarantees the Delaunay partitioning to the semiconductor device deformed by the oxidation calculation.

6. A process simulator as set forth in claim 1, wherein said triangular mesh generating means generates the triangular mesh by setting a new node in the middle of the adjacent nodes where the difference of the impurity concentration is the predetermined value or above, when newly generating the triangular mesh, which guarantees the Delaunay partitioning to the semiconductor device deformed by the oxidation calculation.

7. A process simulation method for calculating an internal physical quantity inside a semiconductor by dividing the semiconductor to be processed into smaller triangular regions and solving partial differential equations analytically, comprising the steps of:

a first step of generating a triangular mesh which guarantees the Delaunay partitioning, on the semiconductor device to be processed;

a second step of defining a control volume to the generated triangular mesh;

a third step of setting up an impurity concentration to the defined control volume;

a fourth step of calculating an oxidation process to the semiconductor device and deforming the triangular mesh;

a fifth step of deforming the control volume according to the triangular mesh deformed by the oxidation calculation;

a sixth step of modifying the impurity concentration defined on the pre-deformed control volume according to the control volume deformed by said control volume deforming means;

a seventh step of newly generating the triangular mesh, which guarantees the Delaunay partitioning to the semiconductor device deformed by the oxidation calculation;

a eighth step of defining a control volume on the newly generated triangular mesh;

a ninth step of transferring the impurity concentration modified by said sixth step to the control volume defined on the newly generated triangular mesh; and a tenth step of performing a diffusion calculation according to the finally determined triangular mesh, control volume and impurity concentration.

8. A process simulation method as set forth in claim 7, wherein the ninth step of transferring the impurity concentration includes a step of seeking the region where the control volume deformed by said control volume deforming means and the control volume defined on the triangular mesh newly generated to the semiconductor device deformed by said triangular mesh generating means overlap each other, a step of calculating the number of the impurity in the overlapping region, a step of setting up the value obtained by dividing the total amount of the impurity in the overlapping region by the area of the control volume defined on the triangular mesh newly generated as the impurity concentration of each node on the triangular mesh newly generated.

9. A process simulation method as set forth in claim 8, wherein in the step of seeking the region where the control volume deformed by the fifth step and the control volume defined newly by the eighth step overlap each other, the configuration of the semiconductor device is roughly divided into rectangular regions of appropriate size beforehand and the overlapping region of the both control volumes only included in the rectangular region is sought.

10. A process simulation method as set forth in claim 7, further comprising:

a step of setting a new joint for forming a triangular mesh if necessary, between the sixth step of modifying the impurity concentration and the seventh step of newly generating the triangular mesh.

11. A process simulation method as set forth in claim 7, further comprising:

a step of setting a new node at a place where the impurity concentration modified by the sixth step varies extremely, between the six step of modifying the impurity concentration and the seventh step of newly generating the triangular mesh.

12. A process simulation method as set forth in claim 7, further comprising:

a step of setting a new node in the middle of the adjacent nodes where the difference of the impurity concentration is the predetermined value or above, between the six step of modifying the impurity concentration and the seventh step of newly generating the triangular mesh.

\* \* \* \* \*